(12) United States Patent
Nagel et al.

(10) Patent No.: US 10,950,657 B2
(45) Date of Patent: Mar. 16, 2021

(54) APPARATUS AND METHODS FOR INTEGRATING MAGNETORESISTIVE DEVICES

(71) Applicant: Everspin Technologies, Inc., Chandler, AZ (US)

(72) Inventors: Kerry Joseph Nagel, Scottsdale, AZ (US); Sanjeev Aggarwal, Scottsdale, AZ (US); Sarin A. Deshpande, Chandler, AZ (US)

(73) Assignee: Everspin Technologies. Inc., Chandler, AZ (US)

( * ) Notice: Subject to any disclaimer, the term of this patent is extended or adjusted under 35 U.S.C. 154(b) by 49 days.

(21) Appl. No.: 16/183,956

(22) Filed: Nov. 8, 2018

(65) Prior Publication Data

US 2019/0140019 A1    May 9, 2019

Related U.S. Application Data

(60) Provisional application No. 62/583,788, filed on Nov. 9, 2017.

(51) Int. Cl.
*H01L 27/22* (2006.01)
*H01L 43/02* (2006.01)
*H01L 43/08* (2006.01)
*H01L 43/12* (2006.01)

(52) U.S. Cl.
CPC .......... *H01L 27/226* (2013.01); *H01L 27/222* (2013.01); *H01L 43/02* (2013.01); *H01L 43/08* (2013.01); *H01L 43/12* (2013.01)

(58) Field of Classification Search
CPC combination set(s) only.
See application file for complete search history.

(56) References Cited

U.S. PATENT DOCUMENTS

| | | | |
|---|---|---|---|
| 8,686,484 | B2 | 4/2014 | Whig et al. |
| 8,747,680 | B1 | 6/2014 | Deshpande et al. |
| 9,023,216 | B2 | 5/2015 | Kochergin et al. |
| 9,136,464 | B1 | 9/2015 | Whig et al. |
| 9,412,786 | B1 | 8/2016 | Andre et al. |
| 9,419,208 | B2 | 8/2016 | Whig et al. |

(Continued)

FOREIGN PATENT DOCUMENTS

WO    WO 2017/155508    9/2017

OTHER PUBLICATIONS

International Preliminary Report on Patentability and Written Opinion issued in International Application No. PCT/US2018/059749, dated Apr. 10, 2019 (20 pages).

(Continued)

*Primary Examiner* — Nduka E Ojeh
(74) *Attorney, Agent, or Firm* — Bookoff McAndrews, PLLC

(57) ABSTRACT

An integrated circuit device includes a memory portion and a logic portion. The memory portion may include a plurality of magnetoresistive devices and the logic portion may include logic circuits. The memory portion may include a plurality of metal conductors separated by a first interlayer dielectric material (ILD), wherein the first ILD is a low-k ILD or an ultra low-k ILD. And, the logic portion may include a plurality of metal conductors separated by a second interlayer dielectric material (ILD).

20 Claims, 12 Drawing Sheets

(56) References Cited

U.S. PATENT DOCUMENTS

| | | |
|---|---|---|
| 9,722,174 B1 | 8/2017 | Nagel et al. |
| 10,262,868 B1* | 4/2019 | Hsieh ................. H01L 21/31116 |
| 2012/0032287 A1 | 2/2012 | Li et al. |
| 2014/0190933 A1 | 7/2014 | Deshpande et al. |
| 2014/0264679 A1* | 9/2014 | Lee .......................... H01L 43/08 |
| | | 257/427 |
| 2015/0079699 A1 | 3/2015 | Deshpande et al. |
| 2016/0093668 A1 | 3/2016 | Lu et al. |
| 2016/0380183 A1 | 12/2016 | Chuang et al. |
| 2017/0092693 A1* | 3/2017 | Tan ........................ H01L 27/228 |
| 2017/0221813 A1* | 8/2017 | Kim ....................... H01L 23/528 |
| 2018/0182810 A1* | 6/2018 | Yi ........................... H01L 43/08 |
| 2018/0309051 A1* | 10/2018 | Deshpande ............ H01L 27/222 |

OTHER PUBLICATIONS

Materials chemistry for low-k materials, Materialstoday, vol. 9, Issue 3, Mar. 2006, pp. 22-31.

\* cited by examiner

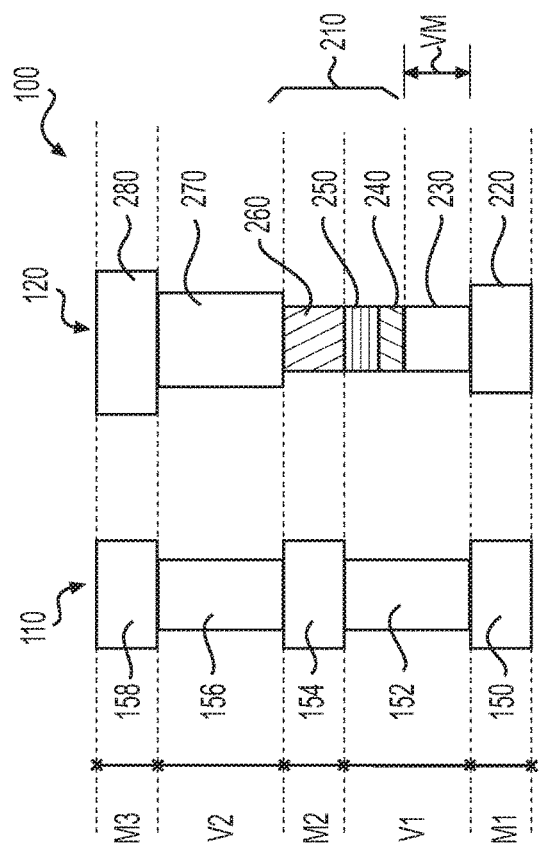
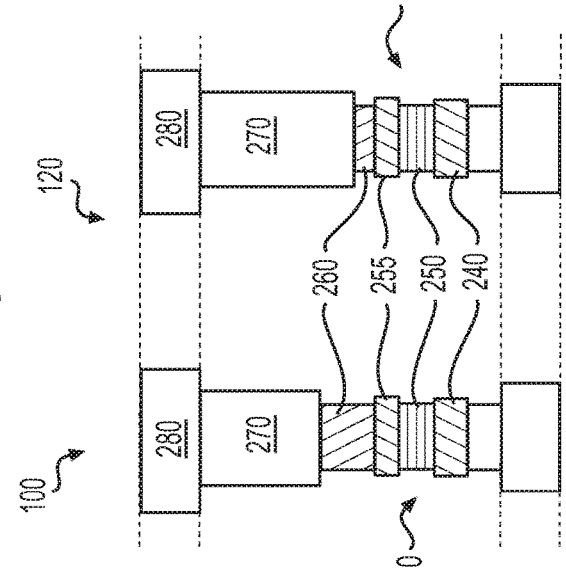
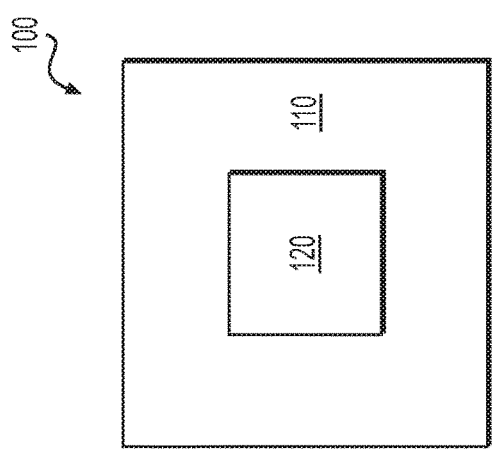
FIG. 1
FIG. 2A
FIG. 2B

APPARATUS AND METHODS FOR INTEGRATING MAGNETORESISTIVE DEVICES

CROSS-REFERENCE TO RELATED APPLICATIONS

This application claims the benefit of priority from U.S. Provisional Application No. 62/583,788, filed on Nov. 9, 2017, which is incorporated by reference herein in its entirety.

TECHNICAL FIELD

The present disclosure relates generally to magnetoresistive devices and more particularly to the integration of magnetoresistive devices on integrated circuits (IC).

INTRODUCTION

Magnetoresistive devices, such as magnetic sensors, magnetic transducers, and magnetic memory cells, include magnetic materials where the magnetic moments of those materials can be varied to provide sensing information or store data. Magnetoresistive devices, spin electronic devices, and spintronic devices are synonymous terms for devices that make use of effects predominantly caused by electron spin. Magnetoresistive memory devices are used in numerous information devices to provide non-volatile, reliable, radiation resistant, and high-density data storage and retrieval. The numerous magnetoresistive devices may include, but are not limited to, Magnetoresistive Random Access Memory (MRAM), magnetic sensors, and read/write heads for disk drives.

Manufacturing magnetoresistive devices includes a sequence of processing steps wherein multiple layers of materials are deposited and patterned to form a magnetoresistive stack and the electrodes used to provide electrical connections to the magnetoresistive stack. The magnetoresistive stack includes the various regions or layers that make up "free" and "fixed" portions of the device as well as one or more intermediate regions (e.g., dielectric layers) that separate these "free" and "fixed" portions, and in some cases, provide at least one tunnel junction for the device. In many instances, the layers of material in the magnetoresistive stack may be relatively very thin, e.g., on the order of a few or tens of angstroms. The term "free" refers to ferromagnetic regions having a magnetic moment that may shift or move significantly in response to applied magnetic fields or spin-polarized currents used to switch the magnetic moment vector of a "free" region. And, the term "fixed" refers to ferromagnetic regions having a magnetic moment vector does not move substantially in response to such applied magnetic fields or spin-polarized currents.

In some applications, magnetoresistive devices may be included on the same integrated circuit with additional surrounding circuitry. For example, magnetoresistive devices (MRAMS, magnetic sensors, magnetic transducers, etc.) may be included on an integrated circuit with a microcontroller or other processing circuitry configured to utilize the information collected by, or stored in, the magnetoresistive devices. Aspects of this disclosure describe magnetoresistive devices and techniques for manufacturing integrated circuits that include magnetoresistive devices that allow for efficient integration with respect to established integrated circuit manufacturing process flows.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments/aspects described herein. Further, the figures depict the different layers/regions of the illustrated stacks as having a uniform thickness and well-defined boundaries with straight edges. However, a person skilled in the art would recognize that, in reality, the different layers typically may have a non-uniform thickness. And, at the interface between adjacent layers, the materials of these layers may alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain features are illustrated with straight 90-degree edges, in reality such features may be more "rounded" and/or gradually sloping or tapered.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Figure 16A:
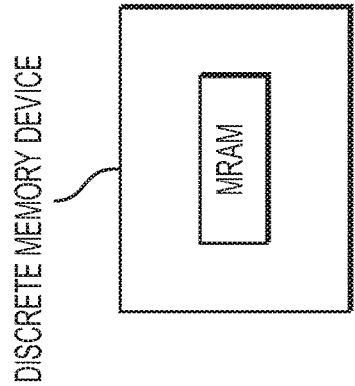
Figure 16B:
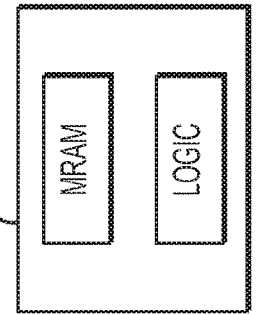
Figure 15:
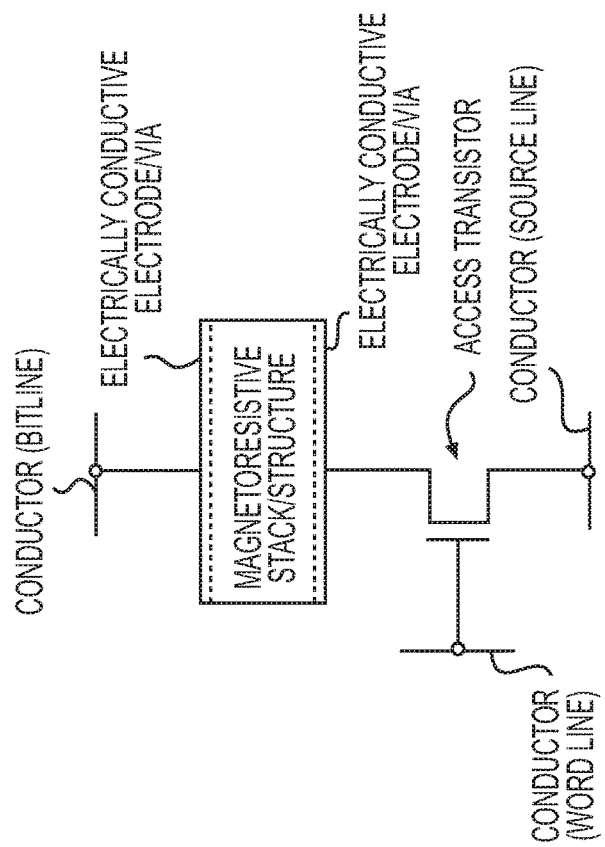

FIG. 1 is an illustration of an exemplary integrated circuit device of the current disclosure;

FIG. 2A and FIG. 2B are cross-sectional illustrations of two exemplary embodiments of the integrated circuit device of FIG. 1;

FIGS. 3-14 are schematic illustrations of the integrated circuit device of FIG. 1 after different exemplary processing steps;

FIG. 15 is a schematic diagram of an exemplary magnetoresistive memory stack electrically connected to a select device, e.g., an access transistor, in a magnetoresistive memory cell configuration; and FIG. 16A-16B are schematic block diagrams of integrated circuits including a discrete memory device and an embedded memory device, respectively, each including an MRAM (which, in one embodiment is representative of one or more arrays of MRAM having a plurality of magnetoresistive memory stacks according to aspects of certain embodiments of the present disclosure).

DETAILED DESCRIPTION

There are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate that the embodiment(s) is/are "example" embodiment(s). Further, even though the figures and this written disclosure appear to describe a particular order of construction (e.g., from bottom to top), it is understood that the depicted structures may have the opposite order (e.g., from top to bottom), or a different order.

For the sake of brevity, conventional techniques related to semiconductor processing may not be described in detail herein. The exemplary embodiments described herein may be fabricated using known lithographic processes. The fabrication of integrated circuits, microelectronic devices, micro electro mechanical devices, microfluidic devices, and photonic devices may involve the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist may be applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that is not exposed to the radiation, is removed by the application of a developer. An etch may then be applied to the underlying layer not protected by the remaining photoresist such that the layer overlying the substrate is patterned. Alternatively, an additive process can be used in which a structure is built up using the photoresist as a template.

There are many inventions described and illustrated herein, as well as many aspects and embodiments of those inventions. In one aspect, the described embodiments relate to, among other things, methods of manufacturing integrated circuits that include magnetoresistive devices having electrically conductive electrodes on either side of a magnetic material stack. While not described in detail herein, the magnetic material stack may include many different layers of material, where some of the layers include magnetic materials, whereas others do not. In some embodiments, the methods of manufacturing include forming the layers of the magnetoresistive devices and then masking and etching those layers to produce the magnetoresistive device. Examples of such devices include transducers such as electromagnetic sensors as well as memory cells.

Magnetoresistive devices can be included on an integrated circuit with other circuitry. In such cases, it is desirable to align the process steps and structures associated with the magnetoresistive devices with the process steps and circuit features associated with the surrounding circuitry. In other words, integrating the manufacture of the magnetoresistive devices into the standard process flow used to manufacture the integrated circuits may be desirably performed in a manner that minimizes the number of additional processing steps and materials needed during production. For example, while some process steps and materials associated with building magnetoresistive devices may be specific to such devices, other process steps and materials used in manufacturing magnetoresistive devices also may be used in manufacturing the surrounding circuitry. As a specific example, conductive layers that are deposited and patterned to form the top and/or bottom electrodes for magnetoresistive devices can also be used to form connective traces and interlayer connections in standard complementary metal oxide semiconductor (CMOS) process flows. As an additional example, embodiments are disclosed in which the interlayer dielectric used in the portion of the integrated circuit that includes magnetoresistive devices is the same standard-process-flow interlayer dielectric used in the remainder of the integrated circuit. Such reuse eliminates the need for additional magnetoresistive-device-specific processing and materials.

FIG. 1 illustrates an exemplary integrated circuit (IC) device 100 that includes a logic portion 110 and a magnetoresistive device portion 120. Logic portion 110 may include logic circuits and other circuits typically manufactured using conventional process flows. The magnetoresistive device portion 120 may include one or more magnetoresistive devices such as, for example, magnetic memory devices (MRAMs), magnetic sensors, magnetic transducers, etc. For brevity, the magnetoresistive device portion 120 is hereinafter referred to as the memory portion 120. As described above, however, magnetoresistive device portion 120 may include any suitable magnetoresistive device. The logic portion 110 may include logic circuit elements that may be inter-coupled using a plurality of metal layers. As discussed in additional detail below, specific embodiments are presented that include at least three layers of metal, often referred to as M1, M2, and M3. Other embodiments may include a greater or lesser number of metal layers. For example, four or more layers of metal. The multiple layers of metal may be vertically spaced-apart from each other and separated by a dielectric material (called interlayer dielectric or ILD). In order to provide electrical coupling between these multiple metal layers (and circuit elements), vias may be formed through the ILD that separates adjacent metal layers. Vias are holes or openings in the ILD within which electrically conductive material is deposited or otherwise provided in order to provide an electrical path between two metal layers on either side of the ILD. In some aspects, the ILD may surround and insulate the vias and/or interconnect wiring of the IC device 100.

Although not shown in FIG. 1, in some cases, the IC device 100 may include a buffer portion between the logic portion 110 and the memory portion 120. The buffer portion may include, e.g., "dummy" magnetoresistive devices that are not intended for active operation. Instead, such "dummy" magnetoresistive devices may be used to facilitate processing of IC device 100. For example, polishing of the IC device 100 may result in "dishing," where an uneven surface results due to the abrupt change from a high density of magnetoresistive devices in portion 120 to a lack of such devices in portion 110. To alleviate such issues, in some embodiments, the buffer portion between the logic and magnetic portions 110, 120 may include "dummy" magnetoresistive devices patterned or tiled to maintain a desired density of magnetoresistive devices between portions 110 and 120. Additionally or alternatively, in some embodiments, other structures designed to facilitate processing may be provided in the buffer portion.

Turning to FIG. 2A, a cross-sectional view of a portion of the IC device 100 (of FIG. 1) is presented to help illustrate an exemplary structure of the logic and magnetic portions 110, 120. In FIG. 2A, the vertical structure on the right illustrates the circuitry associated with an exemplary magnetoresistive device 210 of the memory portion 120, and the vertical structure on the left illustrates an exemplary logic circuit in the logic portion 110.

With specific reference to logic portion 110 of FIG. 2A, M1, M2, and M3 correspond to the vertical space associated with the first metal layer, the second metal layer, and the third metal layer, respectively. V1 corresponds to the vertical space associated with a via that extends between metal layer M1 and metal layer M2, and V2 corresponds to the vertical space associated with a via layer that extends between metal layer M2 and metal layer M3. Turning now to the memory portion 120 of FIG. 2A, a magnetoresistive device 210 may be embedded between metal layer M1 and metal layer M2 of the IC device 100. VM corresponds to the vertical space associated with a via that extends from metal layer M1 to the magnetoresistive device 210. Typically, vias extending through via layer V1 may be referred to as first-level vias, vias extending through via layer V2 may be referred to as second-level vias, and vias that extend from metal layer M1 to the magnetoresistive device in the memory portion 120 (i.e., through VM layer) may be referred to as magnetic vias (or M-vias).

With renewed reference to the logic circuitry of FIG. 2A, a feature 150 (e.g. trace, pad, or other connection point) in the first metal layer M1 may be electrically connected to a feature 154 in the second metal layer M2 using a first-level via 152. Similarly, a feature 158 in the third metal layer M3 may be electrically connected to feature 154 in the second metal layer M2 using a second-level via 156.

With renewed reference to the memory portion 120 of FIG. 2A, magnetoresistive device 210 may include a magnetoresistive stack 250. Magnetoresistive stack 250 may include a plurality of magnetic material layers or regions separated by one or more intermediate layers. In some embodiments, these intermediate layers may be made of a dielectric material and may form one or more tunnel junctions. For example, in some embodiments, the magnetoresistive stack 250 may include an insulating dielectric layer sandwiched between one or more layers on one side (that form a "free" region/layer) and one or more layers on the opposite side (that form a "fixed" region/layer) to form a magnetic tunnel junction. In some examples, the insulating dielectric layer may be replaced with a conductive layer (e.g., a copper layer) sandwiched between the "free" and "fixed" regions/layers. While the specifics of the magnetoresistive stack 250 are not described in detail herein, many different magnetoresistive stacks are known in the art. And, it is contemplated that any magnetoresistive stack now known, or later developed, can be used in conjunction with the teachings presented herein. Exemplary magnetoresistive stacks 250 are described in, for example, U.S. Pat. Nos. 8,686,484; 8,747,680; 9,023,216; 9,136,464; and 9,419,208, each of which is assigned to the assignee of the current application and incorporated by reference in its entirety herein.

The magnetoresistive device 210 of FIG. 2A may also include a bottom electrode 240 and a top electrode 260. Electrodes 240, 260 may be formed of electrically conductive material that enables the magnetoresistive stack 250 to be accessed by surrounding circuitry. A magnetic via (or M-via) 230 may couple the bottom electrode 240 to a feature 220 (e.g., landing pad, trace, etc.) in the first metal layer M1. Similarly, a second-level via 270 may couple the top electrode 260 of the magnetoresistive device 210 to a feature 280 (e.g., landing pad or trace) in the third metal layer M3. In some embodiments, one or both of the bottom electrode 240 and the top electrode 260 may be eliminated and a via may directly provide electrical connectivity between surrounding circuitry and the magnetoresistive stack 250. For example, if the bottom electrode 240 is eliminated, an M-via 230 may directly connect feature 220 to the bottom of the magnetoresistive stack 250. Similarly, if the top electrode 260 is eliminated, a second-level via 270 may directly connect feature 280 to the top of the magnetoresistive stack 250. Although the magnetoresistive device 210 of FIG. 2A is illustrated as being disposed between metal layer M1 and metal layer M3, this is not a requirement. In general, the magnetoresistive device 210 may be incorporated between any two metal layers in the die. For example, in some embodiments, in an IC device having four metal layers (e.g., metal layers M1, M2, M3, and M4), the magnetoresistive device 210 may be incorporated between metal layer M3 and metal layer M4. In some cases, to increase the density of the magnetoresistive devices 210 (for example, by decreasing the spacing between adjacent magnetoresistive devices 210), the magnetoresistive devices 210 may be incorporated between the lower metal layers (e.g., closer to metal layer M1) of an IC device.

Although not illustrated in FIG. 2A, as mentioned previously, the space between the different metal and via layers may be filled with one or more ILD materials, including, but not limited to, conventional materials such as TEOS (Tetraethyl orthosilicate) and silicon dioxide ($S_iO_2$). However, these conventional ILD materials have a relatively high dielectric constant (typically referred to as the k value). As IC devices scale smaller, transistors get closer together, and spacing between the interconnects decrease. The associated higher resistance and capacitive coupling may cause signal delay, known as RC delay, in the circuit. Lowering the dielectric constant, or the k value, of the ILD decreases the RC delay, lowers power consumption, and reduces 'crosstalk' between nearby interconnects. There are many known low-k (or ultra low-k) materials that may be used as the ILD in IC devices. See, for example, "Materials chemistry for low-k materials," Materialstoday, Volume 9, Issue 3, March 2006, Pages 22-31. This reference is incorporated by reference in its entirety herein. There is also a significant amount of ongoing research to determine suitable low-k and ultra low-k ILD materials for IC applications. In the discussion below, both low-k and ultra low-k ILD materials are collectively referred to as low-k ILD materials. As those of ordinary skill in the art will recognize, there are challenges to the implementation of low-k ILD materials in IC devices. For example, incorporating such materials in an IC device requires processing these materials with conventional IC fabrication processes. In some cases, to achieve a sufficiently low-k value in a dielectric material, porosity may introduced into the material. In aspect, the porosity may be introduced by way of air bubbles in the ILD material. Porosity, however, may reduce the mechanical strength of the ILD material significantly, potentially causing issues during processing of the device. For example, fabrication of a typical IC device may include one or more polishing operations (e.g., chemical mechanical polishing (CMP)) used to smooth or planarize the surface of a deposited ILD material. It is known that polishing of a porous low-k ILD material could introduce defects (e.g., by creating pits and cavities) in the material, which could result in an uneven surface of the ILD. Moreover, such defects may cause material entrapment, and other issues, during fabrication. The resulting uneven surface of the ILD may also cause issues during subsequent processing operations (photolithography, deposition, etc.). As will be described below, in some embodiments of the current disclosure, the fabrication process of the IC device 100 may be adapted to incorporate low-k ILD materials in the device without resulting in processing-related issues.

For ease of description, in the discussion below, the dielectric material in the M1 layer is referred to as the M1 dielectric, the dielectric material in the VM layer is referred to as the VM dielectric, the dielectric material in the V1 layer above the VM layer (i.e., dielectric material in the space V1-VM in FIG. 2A) is referred to as the V1 dielectric, the dielectric material in the M2 layer is referred to as the M2 dielectric, the dielectric material in the V2 layer is referred to as the V2 dielectric, and the dielectric material in the M3 layer is referred to as the M3 dielectric.

With reference to FIG. 2B, in some embodiments, the magnetoresistive devices 210 embedded in the memory portion 120 of an IC device 100 may include a, e.g., metal hardmask 255. provided between the top electrode 260 and the magnetoresistive stack 250. The metal hardmask 255 may assist in the fabrication of the magnetoresistive stack 250. In some embodiments, the hardmask 255 may include multiple layers of material (the same or different materials). In some embodiments, the hardmask 255 may assist in forming suitable contact between the second-level via 270 and the magnetoresistive devices 210 (e.g., when the top electrode 260 is over etched). Some exemplary hardmasks are described in U.S. Patent Application Publication Nos. 2015/0079699 and 2014/0190933, which are incorporated by reference in their entirety herein. In some embodiments, as illustrated in FIG. 2B, there may be structural differences between the different magnetoresistive devices 210 embedded in the memory portion 120. These differences may be intentional (i.e., designed to be different) or may occur as a result of processing. For example, as shown in FIG. 2B, variations during processing (e.g., etching, etc.) may cause the top electrode 270 of some magnetoresistive devices 210 to have different dimensions (e.g., shorter) than others. Many other variations are possible. Since such possible variations are well known to those of ordinary skill in the art, they are not described herein. It should be noted that, although the magnetoresistive devices 210 and the features and vias in the logic and the memory portions 110, 120 typically have a substantially circular cross-sectional shape, this is not a limitation. These structures may, in general, have any desired cross-sectional shape (square, rectangular, etc.).

A method of manufacturing IC device 100 will now be described. Since different processes (e.g., deposition techniques, etching techniques, polishing techniques, etc.) involved in the manufacturing of IC devices are well known in the art, detailed description of these techniques is omitted for the sake of brevity. Since the magnetoresistive device 210 is disposed between metal layer M1 and metal layer M3 (for example, as shown in the embodiment of FIG. 2A), processing steps for the IC device 100 below metal layer M1 and above metal layer M3 (or below the lower metal layer and above the upper metal layer in embodiments where the magnetoresistive devices are incorporated between a different lower and upper metal layers) may be performed using conventional IC fabrication processes known in the art. Therefore, description of the processing of the IC device 100 below the M1 layer and above the M3 layer is not described herein. In some embodiments, during fabrication of IC device 100, processing of the memory portion 120 may be compartmentalized, such that, before such processing begins and/or after such processing is complete, a known standard process flow for the IC device 100 may be used. In some embodiments, some of the standard process steps and materials may also be used in the compartmentalized portion of the processing (e.g., the processing used for the memory portion 120), thereby reducing any additional burden associated with the inclusion of magnetoresistive devices 210 in the IC device 100.

Figure 3:
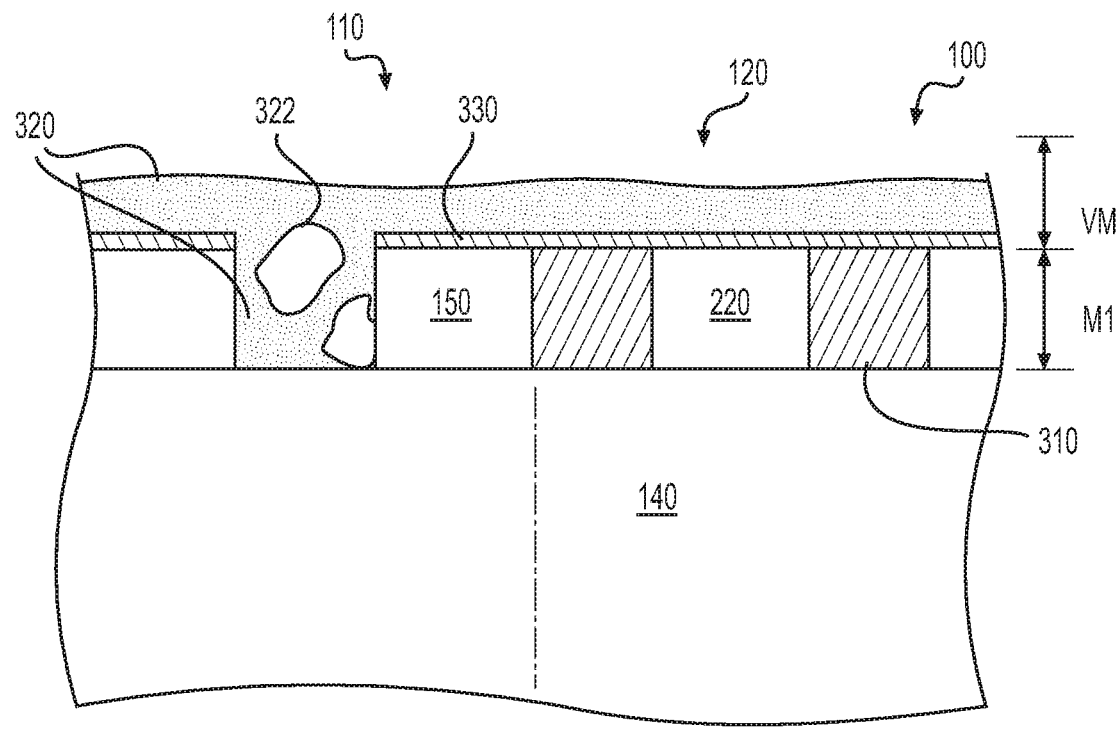

FIGS. 3-12 are a simplified cross-sectional views of an exemplary IC device 100 at different stages of an exemplary manufacturing process. With reference to FIG. 3, metal patterns corresponding to the M1 layer are deposited on the back end (side including circuitry) of a CMOS die 140. These metal patterns include features 220 on the memory portion 120 and features 150 on the logic portion 110 of the die 140. These features 220, 150 may be made of any electrically conductive material (copper, aluminum, suitable alloys, etc.) and may include any type of feature (such as, for example, a landing pad, conductive trace, etc.) that provides electrical connection to CMOS circuitry within the die 140. An M1 layer dielectric may be provided between the features 150, 220 of the M1 layer. In the embodiment illustrated in FIG. 3, the M1 layer dielectric includes a first dielectric 310 provided (deposited, etc.) between the features 220 of the memory portion 120, and a second dielectric 320 provided between the features 150 of the logic portion 110. The first dielectric 310 may include a conventional ILD material (such as, for example, TEOS, $SiO_2$, etc.), and the second dielectric 320 may include a low-k ILD material (such as, for example, carbon doped $SiO_2$ (SiOC), Carbon Doped Oxide (CDO), Organo Silicate Glass (OSG) spin-on organics, etc.), where "low-k" refers to ILD materials with a relatively low dielectric constant. The low-k ILD may be porous or include porogens that induce porosity in the material. Thus, as illustrated in FIG. 3, the M1 layer dielectric may be formed as a bi-material layer, wherein a low-k ILD is provided in the logic portion 110 of the IC device 100 and a conventional ILD is provided in the memory portion 120 of the IC device 100.

It is known that a low-k ILD material has poor gap filling capability. Therefore, depositing the second dielectric 320 between the features 150 causes voids or air gaps 322 to be formed between these features. These air gaps 322 lower the effective k value of the second dielectric 320 since air has a very low k value 1). In some embodiments, the spacing between the features 150 and/or the deposition process may also be tailored to induce the formation of air gaps 322 (e.g., tighter pitch of the features 150 increases the propensity of the air gaps 322, etc.). Providing a low-k ILD material (i.e., second dielectric 320) between the features 150 enables electrical performance benefits (resulting from a lower RC delay) to be realized from the logic portion 110 of the IC device 100. Promoting the formation of air gaps 322 further decreases the effective k value of the second dielectric 320, and results in further electrical benefits. It should be noted that although a random order of airgaps 322 is illustrated, in some embodiments, a series of systematic voids may be formed.

Providing a conventional ILD material (i.e., first dielectric 310) in the M1 layer (e.g., between the features 220) of the memory portion 120 enables magnetoresistive devices to be formed above the M1 layer, without causing processing-related issues. For example, providing a low-k ILD material (such as, for example, second dielectric 320) between features 220 may result in air gaps (similar to air gaps 322) and open pores to be formed between these features. During subsequent processing steps (e.g., deposition of conductive and/or magnetic material used in the magnetoresistive stack), these air gaps and open pores may entrap material (e.g., deposited material, ablated material, etc.) and cause performance issues (e.g., electrical shorting, stray magnetic fields, etc.). Configuring the M1 layer dielectric as a bi-material layer (as illustrated in FIG. 3) results in a compromise that enables electrical performance benefits to be realized from the IC device 100 without causing processing-related issues.

As illustrated in FIG. 3, in some embodiments, a capping layer 330 (formed of, e.g., silicon carbide (SiC), silicon nitride (SiN), etc.) may be formed atop the M1 layer, and a thin layer of the second dielectric 320 may be provided above the capping layer 330. The capping layer 330 may reduce the exposure of the underlying structure to air and also act as an etch stop during subsequent etching operations of the overlying structure (e.g., during formation of the first-level vias and the M-vias). The layer of second dielectric 320 atop the M1 layer may form a part of the VM layer (see FIG. 4A). The structure illustrated in FIG. 3 may be formed by any known process. For example, in some embodiments, the features 150 and 220 of the M1 layer may be formed on or above the surface of the die 140 using known lithographic and deposition steps (e.g., using a photoresist and lithographic techniques to expose selected areas of the die and depositing electrically conductive material in the exposed areas, etc.). The first dielectric 310 may then be deposited between the features 220 of the memory portion 120 (e.g., by masking the areas corresponding to the logic portion 110), and the capping layer 330 may be deposited on or above the features of the M1 layer (e.g., by masking areas where the capping layer is not desired). The second dielectric 320 (formed of a low-k ILD as described above) may then be deposited between the features 150 of the logic portion 110 and over the M1 layer to form a part of the VM layer. The above-described processing steps and sequence of steps are only exemplary, and as known to those of ordinary skill in the art, the illustrated structure may be formed using other processing steps and/or sequence.

Figure 4A:
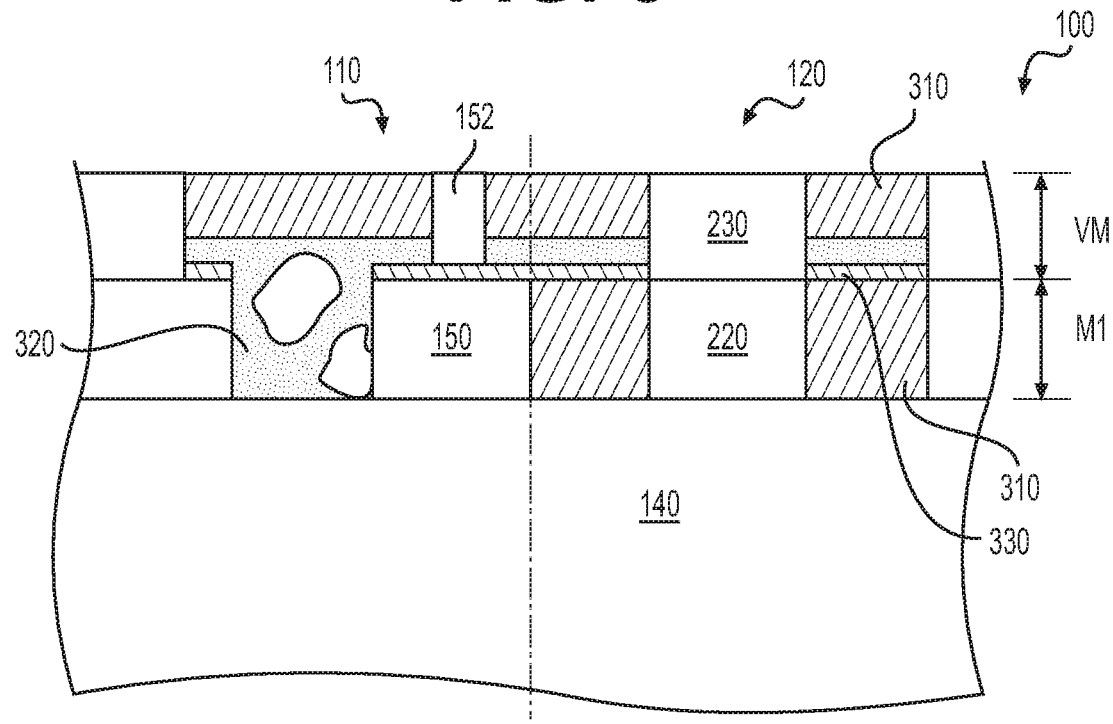

Turning now to FIG. 4A, after depositing the second dielectric 320 on or above the M1 layer and the capping layer 330 (as shown in FIG. 3) to form a part of the VM layer, the first dielectric 310 (made of a conventional ILD material such as TEOS, $SiO_2$, etc.) may be deposited over the second dielectric 320 to complete the VM layer. That is, the VM layer dielectric may also be formed as a bi-material layer, wherein a layer of conventional ILD is provided over a layer of low-k ILD. The thickness of the first and second dielectric 310, 320 in the VM layer may depend on the application and may be selected based on the application. Increasing the relative thickness of the second dielectric 320 decreases the effective k value of the VM layer and may result in greater electrical benefits. However, a very low thickness of the first dielectric 310 may cause potential processing-related issues in the second dielectric 320. Although not a limitation, in some embodiments, the thickness of the first dielectric 310 (i.e., the dielectric made of a conventional ILD material) in the VM layer may be between about 5 to 50% of the thickness of the second dielectric 320 (i.e., the dielectric made of a low K material) in the VM layer. In some embodiments, the thickness of the first dielectric 310 in the VM layer may be between about 10 to 30% of the thickness of the second dielectric 320 in the VM layer. Although the description above implies that the same conventional ILD used in the M1 layer (i.e., between features 220) is also used in the VM layer (i.e., above the second dielectric 320 in the V1 layer), this is not a requirement. Any conventional ILD material (the same material as in the M1 layer or a different material) may be used in the VM layer.

After depositing the first dielectric 310 in the VM layer, the surface of the deposited first dielectric 310 material may be polished (using, for example, chemical-mechanical planarization (CMP)) to prepare the surface of the deposited first dielectric material 310 for subsequent photolithography and etching steps (e.g., to form vias through the deposited dielectric materials 310, 310 (for example, as shown in FIG. 2A)). The M-via 230 and the lower portion of the first-level vias 152 may then be formed through the bi-material ILD of the VM layer. The vias (e.g., M-via 230 and/or first-level vias 152) described herein may be formed by any suitable processes now known or later developed. In some embodiments, these processes may include etching cavities corresponding to the vias 152, 230 through the first and second dielectrics 310, 320 of the VM layer (after exposing areas corresponding to the vias 152, 230 in a photoresist), and depositing one or more electrically conductive materials through the etched cavities to form the vias 152, 230. In some embodiments, the M-vias 230 and the first-level vias 152 may be patterned at the same time. In some embodiments, one of these vias (M-vias 230 or the first-level vias 152) may be patterned and/or formed first (i.e., by masking the logic or the memory portion). Without limitation, the vias 153, 230 (and the features of the metal layers) may be formed by any type of electrically conductive material (copper (Cu), tantalum (Ta), tantalum nitride (TaN), cobalt tungsten phosphide (CoWP), copper with Ta/TaN or CoWP as a barrier material, etc.). In some embodiments, CoWP may be deposited on or above copper as a capping layer. In some embodiments, as illustrated in FIG. 4A, the M-vias 230 in the memory portion 120 may be formed with a relatively larger cross-sectional dimension than the first-level vias 152 in the logic portion 110. M-vias 230 with relatively larger cross-sectional dimensions may provide landing tolerance for the magnetoresistive devices 210 (see FIG. 2A) that will be formed thereon. The M-vias 230 may, in general, have any suitable size, configuration, and cross-sectional dimension. Although not a requirement, in some embodiments, the M-vias 230 may be formed with a relatively larger cross-sectional dimension (e.g., diameter) than the feature 220 that it lands on to provide landing tolerance. And, in some embodiments, the M-vias 230 may have a relatively smaller cross-sectional dimension (e.g., diameter) than the magnetoresistive devices 210 (e.g., bottom electrodes 240 of the device 210) that contact the M-Via 230.

Forming the VM layer dielectric as a bi-material dielectric layer, e.g., where a layer of conventional ILD (first dielectric 310) is deposited over low-k ILD (second dielectric 320), may result in electrical performance improvements (e.g., lower RC delay), while also enabling polishing of the VM layer without inducing defects in the low-k ILD. For example, as explained previously, polishing (such as, for example, by CMP) a low-k ILD material may induce defects (such as, cavities, excessive material removal, etc.) in the ILD material that can trap material during subsequent processing operations, and cause performance issues. Covering or coating the mechanically weaker low-k ILD (e.g., the second dielectric 320) with a relatively tougher conventional ILD material (e.g., the first dielectric 310) enables electrical performance benefits to be realized while allowing the VM layer to be processed (e.g., polished) without causing processing-related issues in the IC device 100.

Figure 4B:
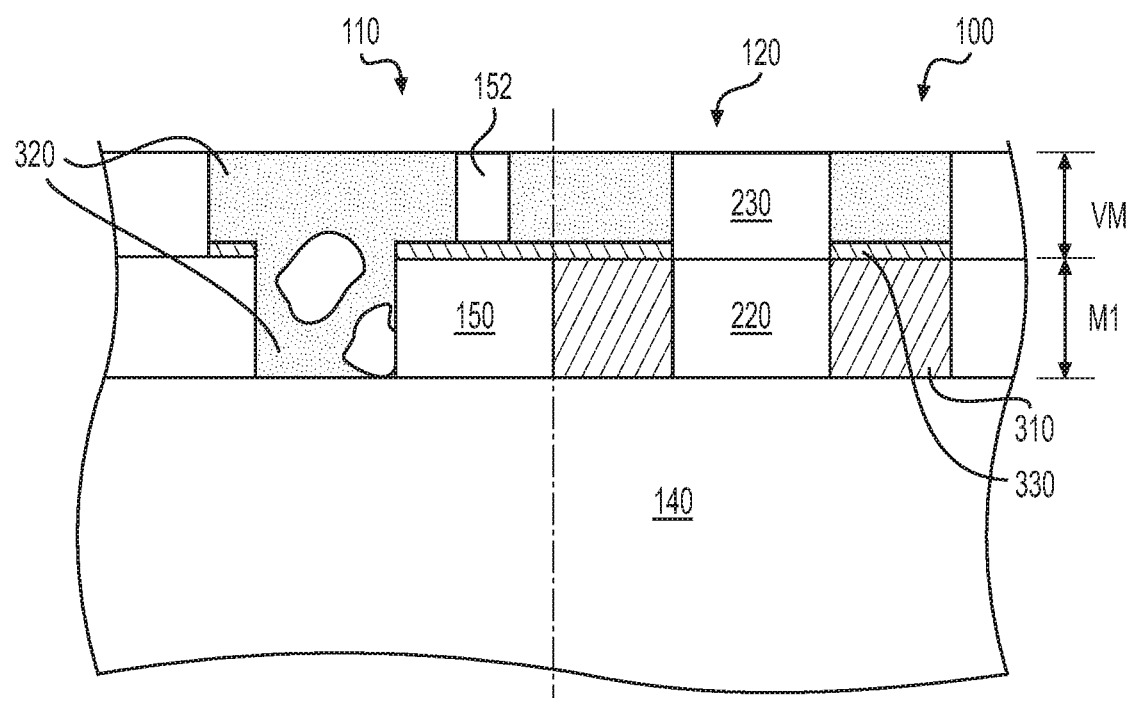

As explained above, increasing the thickness of the second dielectric 320 in the VM layer (of FIG. 4A) may decrease the effective k value of the VM layer dielectric and may provide electrical benefits. In some embodiments, as illustrated in FIG. 4B, substantially the entire VM layer (or in some embodiments, a majority of the VM layer) is formed of a low-k ILD such as the second dielectric 320. In some such embodiments, the second dielectric 320 (or another low-k ILD material) may make up substantially the entire thickness of the VM layer, and a thin layer of a conventional ILD (e.g., TEOS, etc.) (not shown) may be deposited on or above the second dielectric 320 as a sacrificial layer. The sacrificial layer of conventional ILD may then be removed by polishing. In some instances, in addition to removing the sacrificial layer, the polishing process may also grind the underlying low-k ILD layer (e.g., the second dielectric 320) and planarize the VM layer, without damaging the low-k ILD. Thus, in the embodiment of FIG. 4B, the k value of the VM layer is further decreased (compared to the embodiment of FIG. 4A) while allowing this layer to be processed without inducing defects. Although not shown in FIG. 4B, in some embodiments, a thin layer of the conventional ILD layer may remain on top of the second dielectric 320 in the VM layer. It is also contemplated that, in some embodiments, the second dielectric 320 in the VM layer may be polished (i.e., without a sacrificial layer as explained above), using a polishing process (such as, for example, copper CMP) that does not induce defects in the low-k ILD. The M-vias 230 and the lower portion of the first-level vias 152 may then be formed through the second dielectric 320 as described with reference to FIG. 4A.

Figure 5:
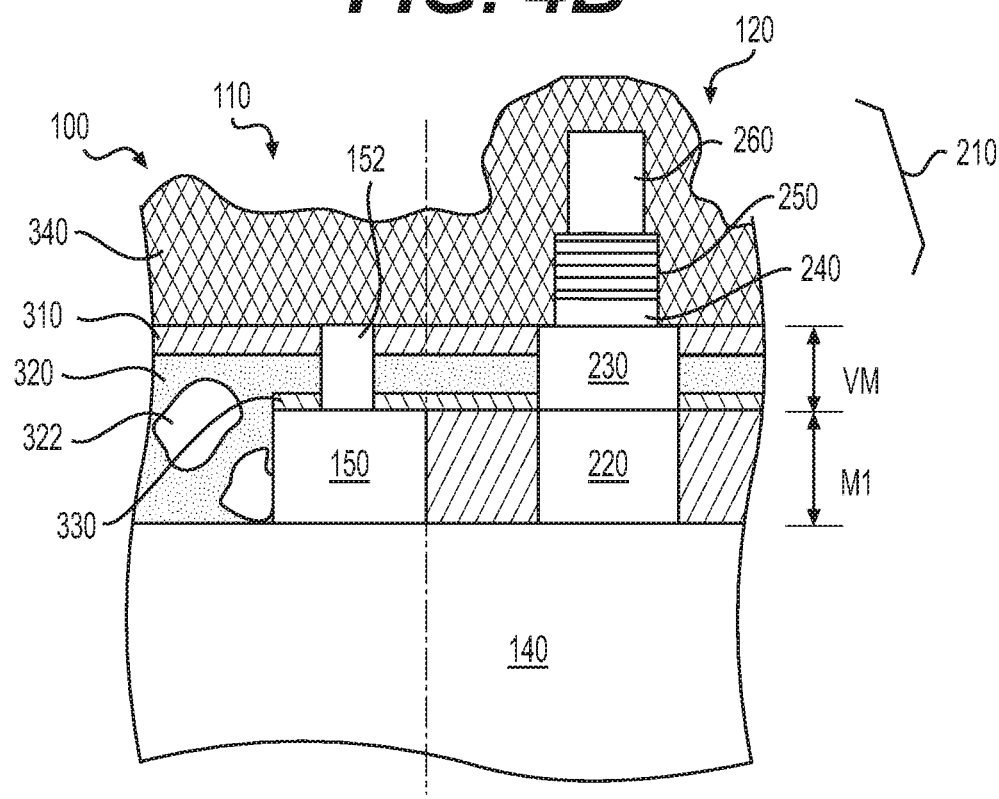

Although not illustrated in FIGS. 4A and 4B, in some embodiments, a capping layer (not shown) also may be deposited on or above the VM layer. Such a capping layer may be similar to capping layer 330, which, as described above, may be deposited on or above the M1 layer. The capping layer (which in some embodiments may include SiC, SiN, etc.) on or above the VM layer may be configured to protect the underlying dielectric material from atmosphere conditions, and may serve as an etch stop during processing of the overlying material. Magnetoresistive devices 210 (of any desired type) may then be formed on or above the M-vias 230 of the memory portion 120, as illustrated in FIG. 5. As known to a person of ordinary skill in the art, in some embodiments, the thickness (and or material) of the capping layer on or above the VM layer may be adapted to account for any expected gouging or etching of the capping layer when etching the magnetoresistive stack 250 (see FIG. 2A) to form the magnetoresistive device 210. Although FIG. 5 illustrates magnetoresistive device 210 formed on the IC device 100 of FIG. 4A (i.e., where the VM layer is formed as a bi-material layer) this is only exemplary. The magnetoresistive device 210 may also be formed on the IC device 100 of FIG. 4B. Magnetoresistive device 210, which includes a magnetoresistive stack 250 (and, in some instances, additionally include a bottom electrode 240 and a top electrode 260) may be formed by any currently known or future-developed method. In some embodiments, the magnetoresistive device 210 may also include other features (such as, for example, hardmask 255, as shown in FIG. 2B). As known to those having ordinary skill in the art, some such methods may include depositing and processing (etching, annealing, etc.) materials corresponding to the bottom electrode 240, the multiple layers of the magnetoresistive stack 250, and the top electrode 260, to form the magnetoresistive device 210. Since exemplary methods of forming magnetoresistive devices 210 are known in the art (e.g., described in U.S. Pat. Nos. 8,686,484; 8,747,680; 9,023,216; 9,136,464; 9,412,786; 9,419,208; 9,722,174; U.S. patent application Ser. No. 16/107,543, filed on Aug. 21, 2018, and Ser. No. 16/108,762, filed on Aug. 22, 2018, each of which is incorporated herein in their entireties), they are not discussed further herein.

Figure 6A:
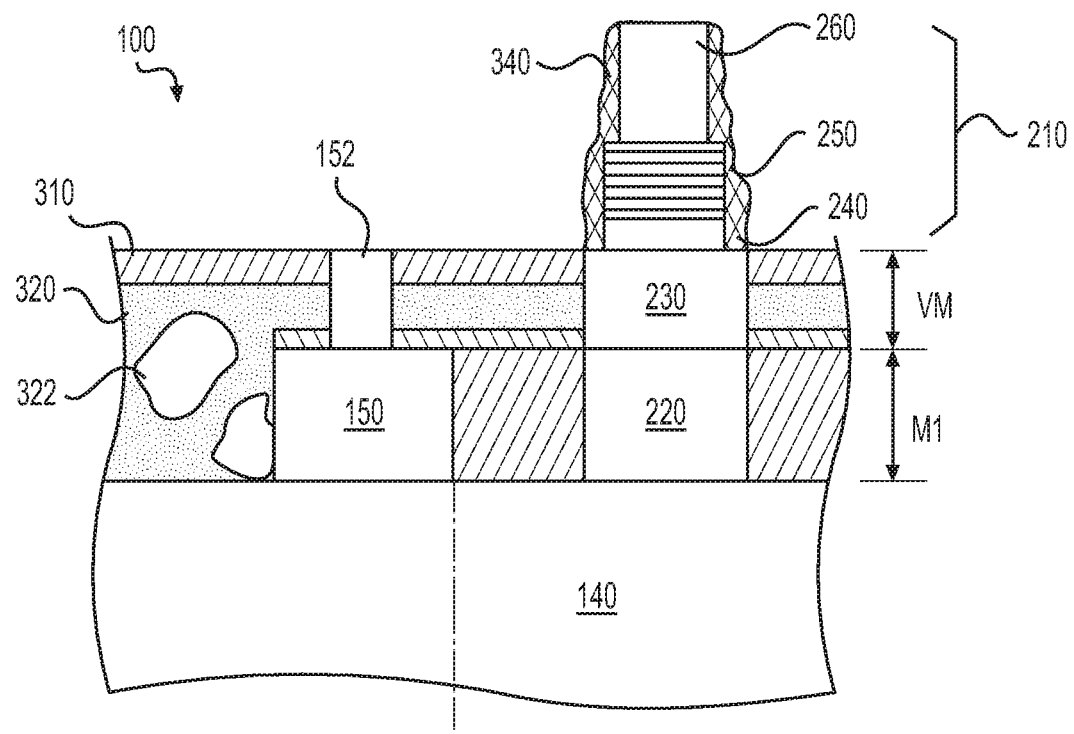
Figure 6B:
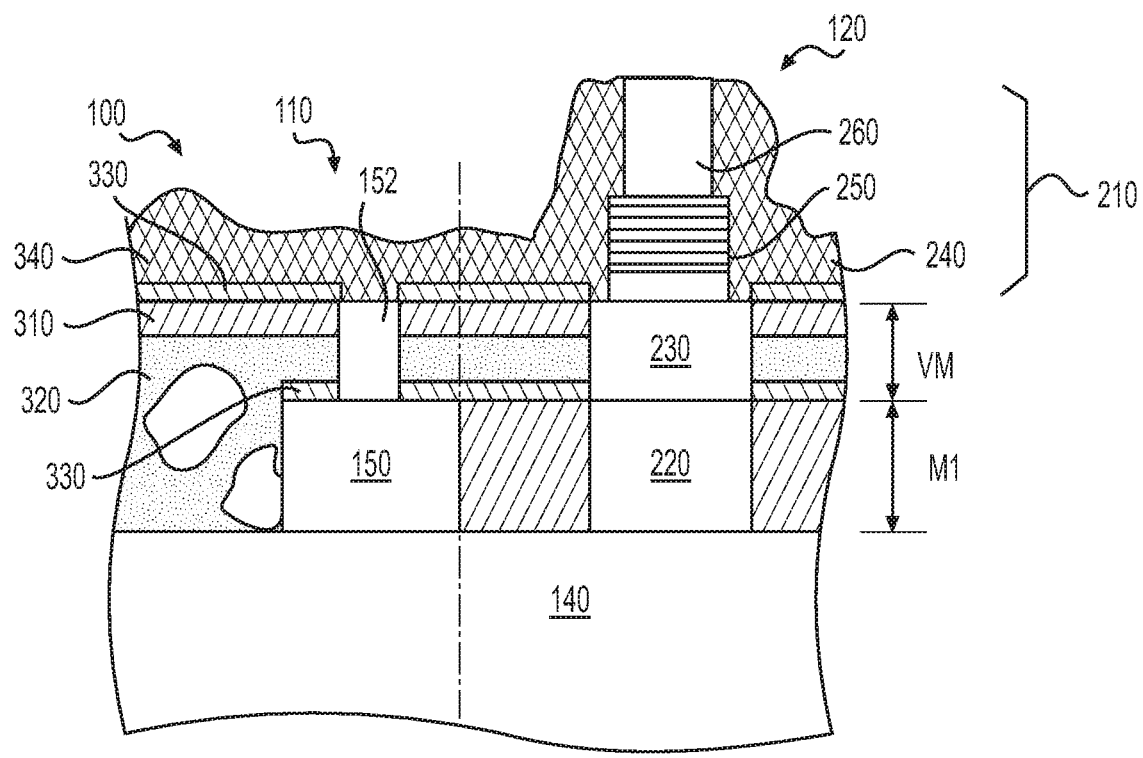

With continuing reference to FIG. 5, after formation of the magnetoresistive devices 210, an encapsulant 340 may be deposited on the surface of the IC device 100 to cover the formed magnetoresistive devices 210. Any suitable process (e.g., chemical vapor deposition (CVD), atomic layer deposition (ALD), etc.) may be used to deposit the encapsulant 340. The encapsulant 340 may include any electrically non-conductive material (such as, for example, silicon nitride (e.g., $Si_3N_4$, SiN, etc.), silicon oxide (e.g., $SiO_2$, $SiO_x$, etc.), etc.), and may in general, be deposited over the entire field to cover both the logic portion 110 and the memory portion 120 of the IC device 100. The deposited encapsulant 340 may then be etched (or removed by another suitable process) such that only the sides of the formed magnetoresistive devices 210 remain covered by the encapsulant 340, as illustrated in FIG. 6A. That is, the deposited encapsulant 340 may be selectively removed from the top of the magnetoresistive devices 210 (i.e., top of the top electrode 260) and other areas of the IC device 100 except the region immediately surrounding the magnetoresistive devices 210. Any suitable process (e.g., masking and etching, etc.) may be used to selectively remove the encapsulant 340 from the IC device 100. In some embodiments, as illustrated in FIG. 6B, the encapsulant 340 may be only removed from the top of the magnetoresistive devices 210. That is, the deposited encapsulant 340 is not removed from any other area except the top of the magnetoresistive devices 210. In some embodiments, the deposited encapsulant 340 may not be removed at all. In some embodiments, as shown in FIG. 6B, for example, a capping layer 330 may also be provided on the surface of the ILD that forms the top surface of the VM layer (that is, the top surface of the first dielectric 310 in the embodiment of FIG. 4A, or the top surface of the second dielectric 320 in the embodiment of FIG. 4B). Capping layer 330 may serve as an etch stop when the encapsulant 340 over the partially formed first-level via 152 is etched in a subsequent step.

Figure 7A:
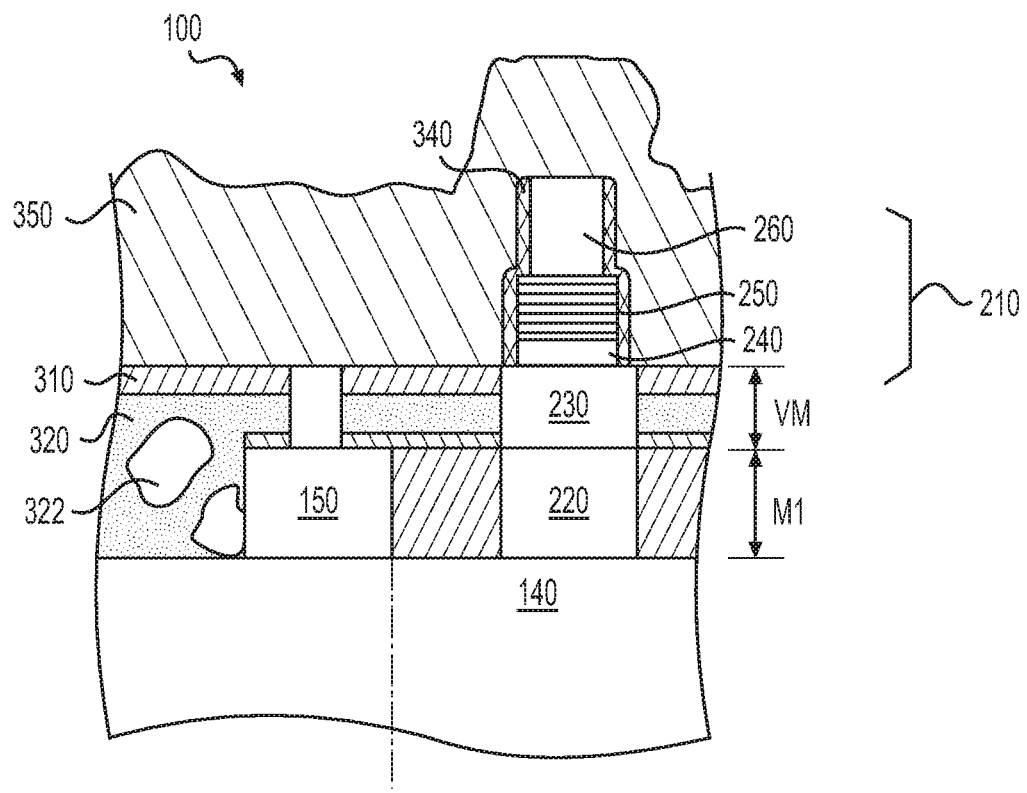
Figure 7B:
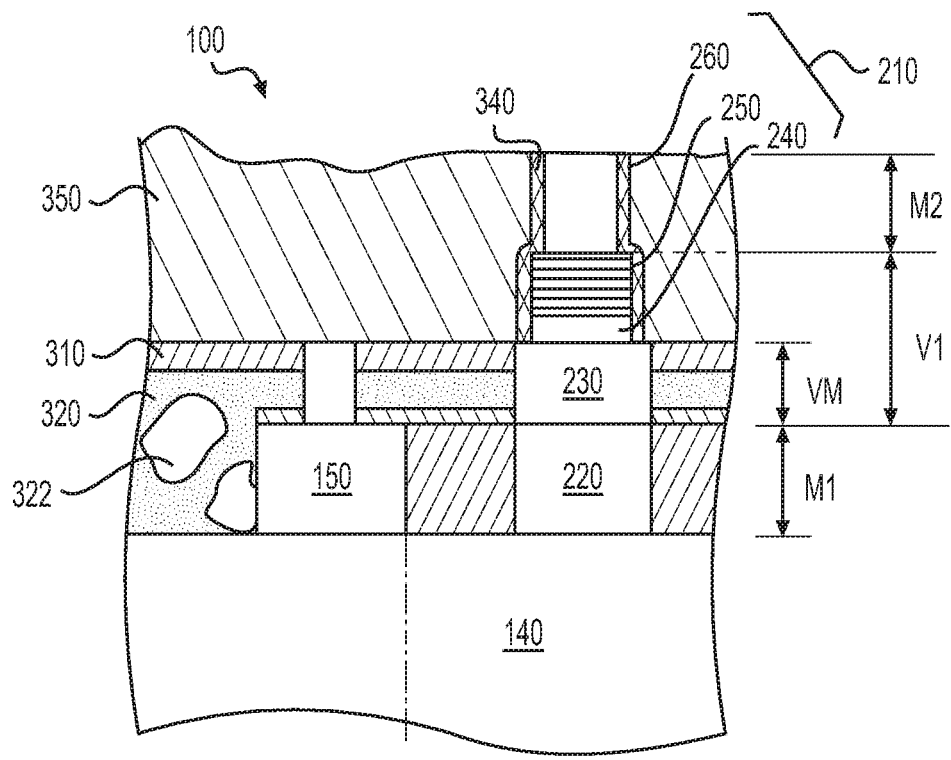

In some embodiments, a third ILD 350 may then be deposited over the surface of the IC device 100 to cover the encapsulated magnetoresistive devices 210. FIG. 7A illustrates the third ILD 350 deposited over the encapsulated magnetoresistive devices 210 of FIG. 6A. Although not illustrated, the third ILD 350 may also be similarly deposited over the encapsulated magnetoresistive devices 210 of FIG. 6B. The third ILD 350 may be deposited by any known (or future-developed) method (e.g., CVD, ALD, etc.). In some embodiments, similar to the first ILD 310, the third ILD 350 may also be formed of a conventional ILD material (TEOS, $SiO_2$, etc.). In some embodiments, the third ILD 350 may be formed of the same material as the first ILD 310. As illustrated in FIG. 7B, the surface of the IC device 100 may then be polished to again expose the surface of top electrode 260 of the magnetoresistive devices 210. Any known polishing method (e.g., CMP, etc.), or another material removal method (e.g., etching, etc.), may be used to remove portions of the deposited third ILD 350 and expose the surface of the top electrode 260. As would be recognized by those of ordinary skill in the art, in some embodiments, portions (e.g., on the surface) of the top electrode 260 may also be removed during this polishing process.

Figure 8A:
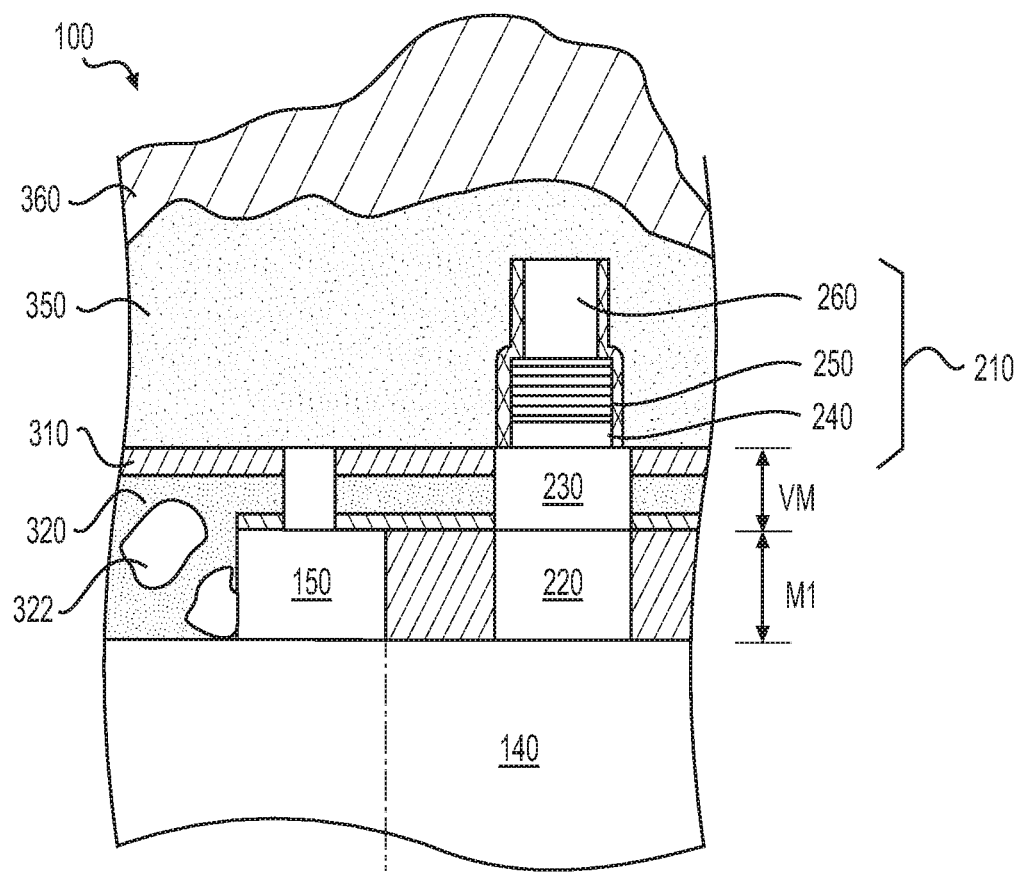
Figure 8B:
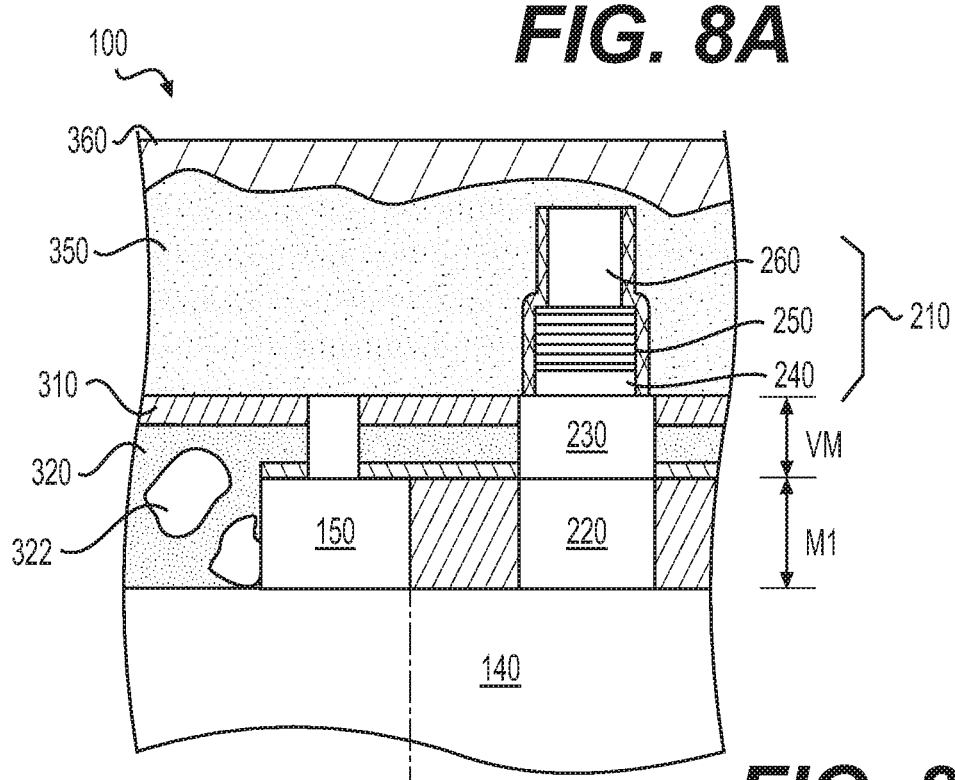

In some embodiments, as illustrated in FIG. 8A, the third ILD 350 deposited over the encapsulated magnetoresistive devices 210 may be a low-k ILD. The third ILD 350 may be formed of the same material (or similar material) as the second ILD 320. In some embodiments, as illustrated in FIG. 8A, a fourth ILD 360 may also be deposited over the third ILD 350. The fourth ILD 360 may include a conventional ILD material (such as, for example, TEOS, $SiO_2$, etc.), and may serve as a sacrificial layer used to assist polishing and planarizing of the underlying low-k ILD (i.e., third ILD 350). As explained previously, conventional polishing operations (such as, for example, CMP) may induce defects in a low-k ILD. And, as explained with reference to FIG. 4B, polishing the conventional ILD (i.e., fourth ILD 360) deposited over the low-k ILD may facilitate grinding and/or planarizing of the underlying low-k ILD without inducing defects therein. FIG. 8B illustrates the IC device 100 after the surface of the fourth ILD 360 is polished. In some embodiments, the fourth ILD 360 may be polished such that the underlying third ILD 350 (i.e., the low-k ILD) is not directly polished (i.e., not touched by the polishing wheel). In some such embodiments, as illustrated in FIG. 8B, a small layer of the fourth ILD 360 may be retained over the third ILD 350 after the polishing operation. In some embodiments, the polishing may extend into the third ILD 350. It is also contemplated that, in some embodiments, the fourth ILD 360 may be eliminated, and the third ILD 350 may be polished, or planarized by a method (such as, for example, copper CMP) that does not induce consequential defects in the low-k ILD. In some embodiments, the CMP process may be eliminated.

Figure 8C:
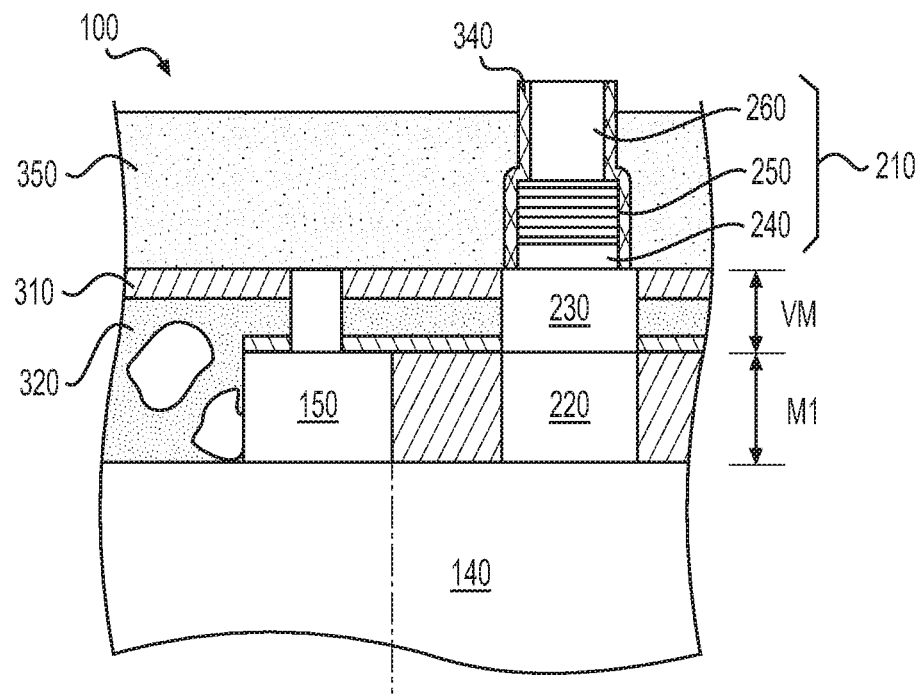

The surface of the IC device 100 may then (with or without a prior CMP process) be etched to etch back the fourth ILD 360 and the underlying third ILD 350 to expose the top electrode 260 of the encapsulated magnetoresistive devices 210. FIG. 8C is an illustration of the IC device 100 after etching back the fourth and third ILDs 360, 350, respectively. The etching process may planarize the third ILD 350 sufficiently for subsequent lithographic steps. Any suitable etching process (e.g., reactive ion etching (RIE), etc.) may be used to etch back the fourth and third ILDs 360, 350, respectively. Turning now to FIG. 8C, in some embodiments, a portion of the encapsulated top electrode 260 may extend over the top surface of the etched third ILD 350. In some embodiments, a subsequent metal polish step, such as, for example, a copper polish step (after the feature 154 of the M2 layer is formed over the logic portion 110, see FIG. 9) may remove this protruding portion of the top electrode 260. In embodiments where the encapsulant 340 was not previously removed from the top surface of the top electrode 260, the etching process may also remove the encapsulant 340 from a topmost surface of the top electrode 260. That is, the etchant used in the etching process may also be selective to the encapsulant 340. In some embodiments, this portion of the encapsulant 340 may also be removed in the subsequent metal polish step.

In some embodiments, the chemistry of the etchant may be selected to achieve a desired selectivity to the etched materials (third ILD 350, fourth ILD 360, encapsulant 340, etc.). For example, the etchant chemistry may be selected to achieve a selectivity of approximately 1:1 (or any other desired ratio) for the third ILD 350 and the fourth ILD 360. In some embodiments, the etch chemistry may be adjusted during the etching process to achieve a desired selectivity for a material. For example, in some embodiments, during the initial stages of the etching process, the etchant chemistry may be adjusted to be more selective to the fourth ILD 360. After a while (e.g., after the fourth ILD 360 is removed or substantially removed), the chemistry of the etchant may be adjusted to be more selective to the third ILD 350 until the third ILD 350 is completely removed (or substantially removed). The etchant chemistry may then be adjusted to be selective to the encapsulant 340 to remove the encapsulant 340 so as to expose top electrode 260.

Figure 9:
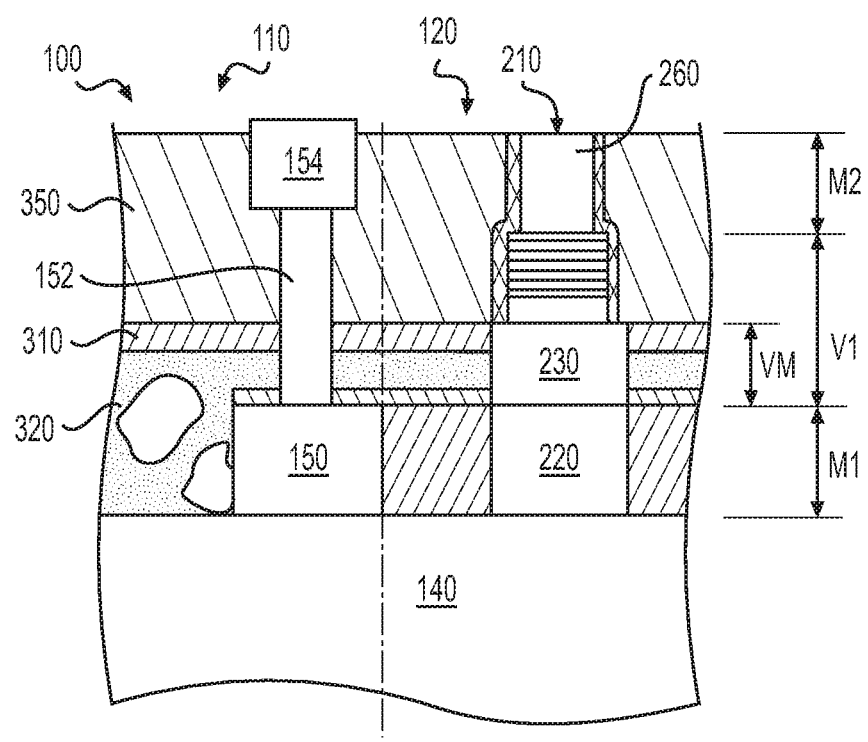

Formation of the top portion of the first-level vias 152 and features 154 of the M2 layer in the logic portion 110 of the IC device 100 is now described. FIG. 9 illustrates the IC device 100 with a first-level via 152 and a feature 154 formed thereon. Any known process (e.g., dual damascene process), or a suitable future-developed process, may be used to etch cavities in the third ILD 350 and deposit an electrically conductive material in these cavities to form these conductive structures. Any electrically conductive material (for example, the same materials used to form feature 150 of the M1 layer) may be used to form the first-level via 152 and feature 154. In some embodiments, the surface of the deposited metal may then be polished in a metal polishing step. Note that the third ILD 350 of FIG. 9 may be formed of a conventional ILD material (as described with reference to the embodiment of FIG. 7B) or a low-k ILD material (as described with reference to the embodiment of FIG. 8C). Forming the V1 layer and the M2 layer on a low-k ILD material (as in the embodiment of FIG. 8C) lowers the k value of the device 100, and may assist in improving electrical performance.

Figure 10:
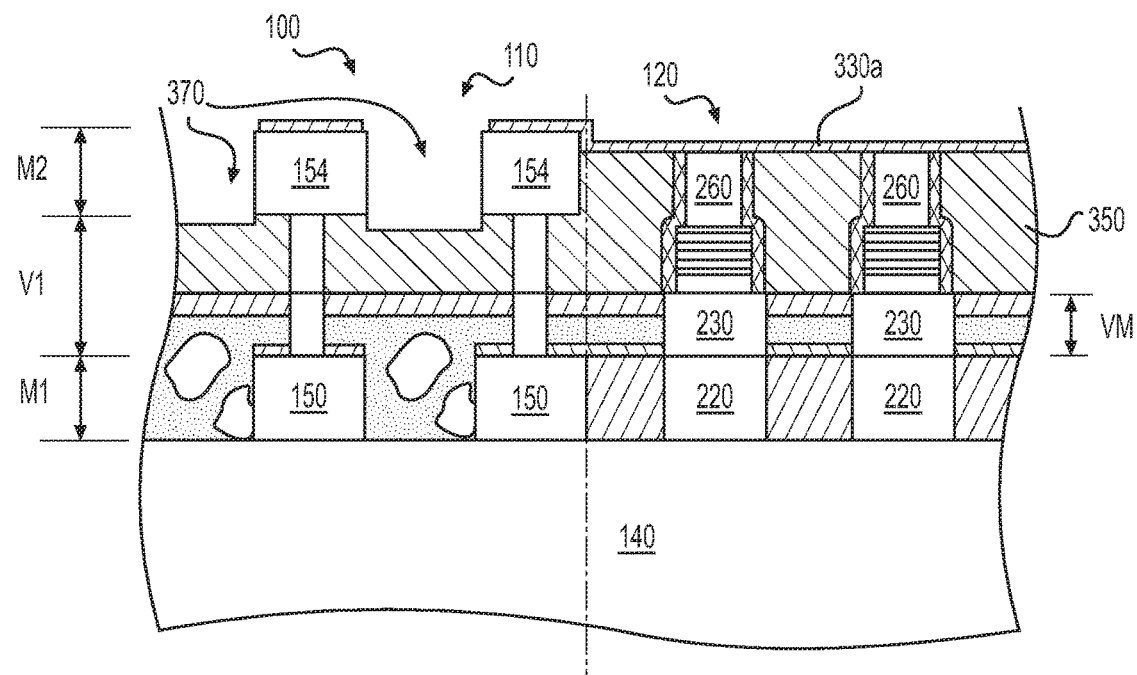

In some embodiments, after forming the first-level vias 152 and the features 154 through the third ILD 350 (as described with reference to FIG. 9), cavities may be formed between adjacent features 154 of the M2 layer in the logic portion 110 of the IC device 100. Although not shown in FIG. 9, in some embodiments, similar cavities may also be formed between the top electrodes 260 (of the magnetoresistive devices 210) in the memory portion 120 of the device 100. FIG. 10 is an illustration of the IC device 100 with cavities 370 formed in the third ILD 350 (made of a conventional ILD or a low-k ILD) between the features 154. In some embodiments, as illustrated in FIG. 10, these cavities 370 may be formed all around the features 154 such that the features 154 form islands with cavities 370 surrounding them. Any known method, such as, for example, etching, may be used to form the features. In some embodiments, as illustrated in FIG. 10, a capping layer 330a may be deposited on the surface of the IC device 100 to act as an etch stop when the cavities 370 are etched.

Figure 11:
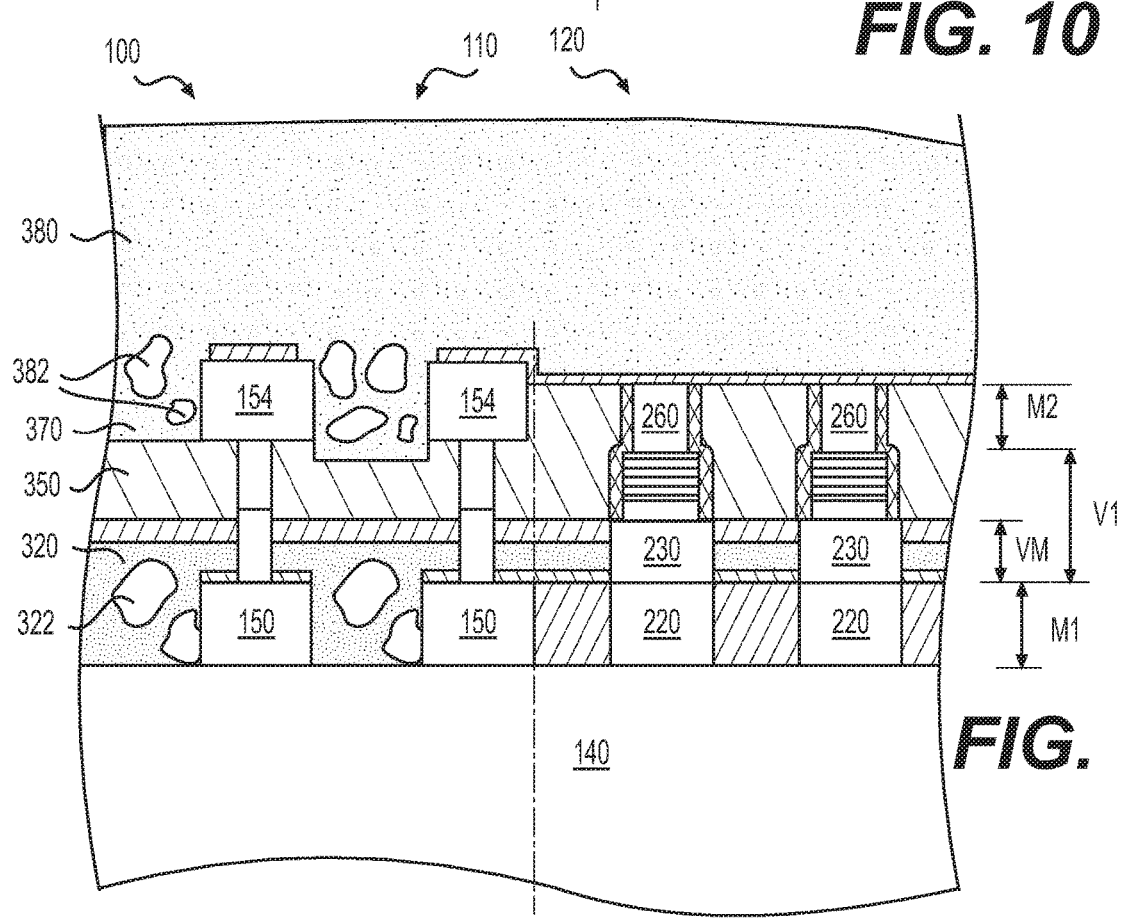

A fifth ILD 380 may then deposited on the IC device 100 so that the fifth ILD 380 fills the cavities 370 and forms a layer on the surface of the IC device 100. FIG. 11 is an illustration of the IC device 100 with the fifth ILD 380 deposited thereon. In some embodiments, the fifth ILD 380 may be a low-k ILD. In some embodiments, the fifth ILD 380 may be formed of the same (or similar) material as the second ILD 320 and/or the third ILD 350 (in embodiments where the third ILD 350 is also a low-k ILD). Any deposition process (CVD, ALD, etc.) may be used to deposit the fifth ILD 380. Because of the poor gap filling characteristics of low-k ILD (discussed previously), as illustrated in FIG. 11, air gaps 382 may result in the fifth ILD 380 in the cavities 370. In some embodiments, the ILD deposition process and/or the layout of the M2 layer may be tailored to promote the formation of the air gaps 382 in the cavities 370 between the features 154. In embodiments, where the third ILD 350 is a low-k ILD material, forming cavities 370 and depositing the fifth ILD 380 (also made of a low-k material) therein allows air gaps 382 to be introduced into the space between the features 154. As explained previously, these air gaps 382 further decrease the k value of the dielectric, and helps in improving electrical performance of the IC device 100.

Figure 12A:
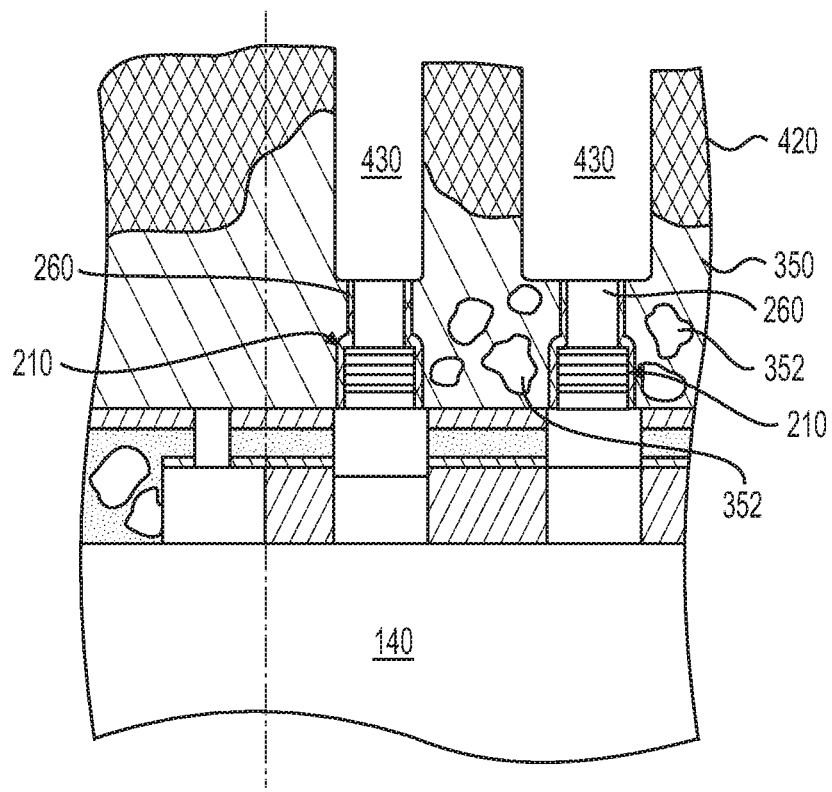
Figure 12B:
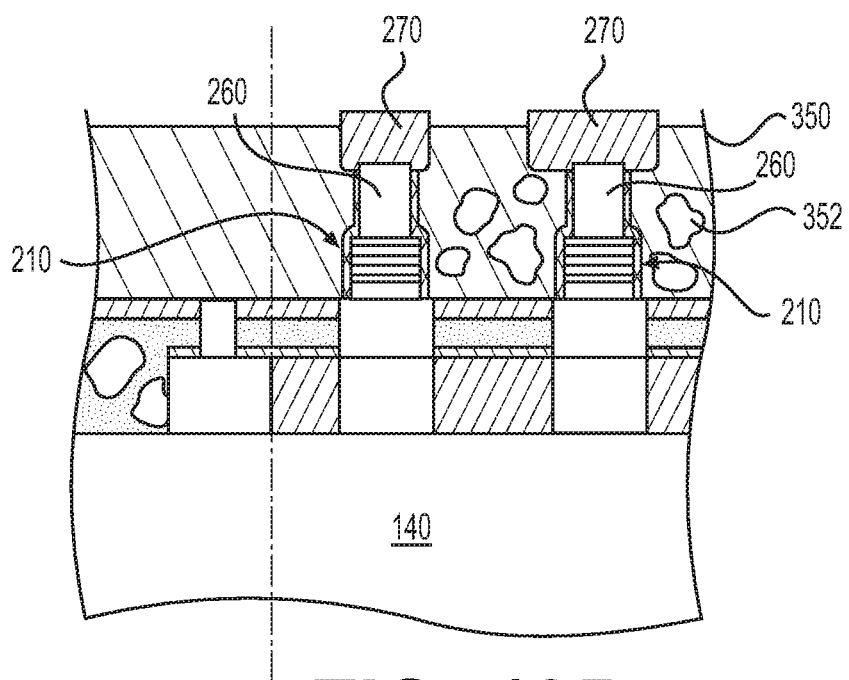

In embodiments where cavities are also formed between the magnetoresistive devices 210, the deposited fifth ILD 380 may also fill these cavities and form air gaps between the magnetoresistive devices 210 in the memory portion 120 (see, for example, FIGS. 12A and 12B). Typically, use of a conventional ILD material (such as, for example TEOS) around the circuits of the logic portion 110 is detrimental to the electrical performance (due to high capacitance) of the IC device 100. In embodiments where the third ILD 350 is made of a conventional ILD material (such as, for example TEOS), providing a low-k ILD material with air gaps 382 in the cavities 370 around the features 154 helps in decreasing the k value of the dielectric layer, and may assist in improving electrical performance.

With renewed reference to FIG. 7A, in some embodiments, after the third ILD 350 (made of a low-k ILD or a conventional ILD) is deposited over the encapsulated magnetoresistive devices 210, vias may be formed through the as-deposited ILD to form vias (e.g., to contact the magnetoresistive devices 210). That is, these vias may be formed without polishing or planarizing the surface of the deposited ILD (as described with reference to FIGS. 8A-8C). FIGS. 12A and 12B illustrate an exemplary embodiment of the IC device 100 where a via is formed through an as-deposited ILD layer, i.e., third ILD 350. With reference to FIG. 12A, a photoresist 420 may be deposited over the as-deposited third ILD 350 and exposed to uncover or unmask selected regions of the third ILD 350 over the magnetoresistive devices 210. The third ILD 350 in these exposed regions is then etched to form cavities 430 corresponding to the second-level vias 270 of the memory portion 120. The via material (which, as explained above, may be electrically conductive material, such as, for example, copper, etc.) may then be deposited in these cavities 430 to form the second-level vias 270. The photoresist 420 may then be stripped, and the surface of the third ILD 350 polished to planarize the topography of the third ILD 350 surface, and prepare this surface for subsequent lithographic steps (e.g., to form the M3 layer). In embodiments where the third ILD 350 is a low-k ILD material, the surface of the ILD may be polished using a technique (such as, for example, metal polishing step) that does not induce damage (or minimizes damage) to the low-k ILD material. FIG. 12B illustrates the IC device 100 with the surface of the third ILD 350 polished after depositing the via material to form second-level vias 270. Although not illustrated in FIGS. 12A and 12B, in some embodiments, the circuits of the logic portion 110 (for example, first-level vias 152, features 154, etc.) may also be formed simultaneously with the circuits of the memory portion 120.

With continuing reference to FIGS. 12A and 12B, in some embodiments, air gaps 352 may be introduced in the third ILD 350 between the magnetoresistive devices 210. In some embodiments, the ILD deposition process may be configured to form these air gaps 352. In some embodiments, a cavity may be etched in a deposited ILD layer (conventional or low-k ILD), and a low-k ILD material deposited (e.g., using a process tailored to create air gaps) in this cavity to form the air gaps 352. For example, cavities (similar to cavities 370 of FIG. 10) may be formed between the magnetoresistive devices 210, and a low-k ILD material (the same or similar to the material as the third ILD 350 or a different low-k ILD material) may be deposited in these cavities to form the air gaps 352. In embodiments where the third ILD 350 is a low-k ILD, the air gaps 352 may be introduced as a result of the poor gap filling characteristics of the material during the deposition, or the deposition process may be configured to produce these air gaps 352.

In some embodiments, the surface of the as-deposited third ILD 350 may be polished or planarized before forming the second-level vias 270. For example, as described with reference to FIG. 8A, after the third ILD 350 is deposited over the encapsulated magnetoresistive devices 210, a sacrificial fourth ILD 360 (made of a conventional ILD material) may be deposited over the third ILD 350. The surface of the sacrificial fourth ILD 360 may then be polished to planarize the surface.

Figure 13A:
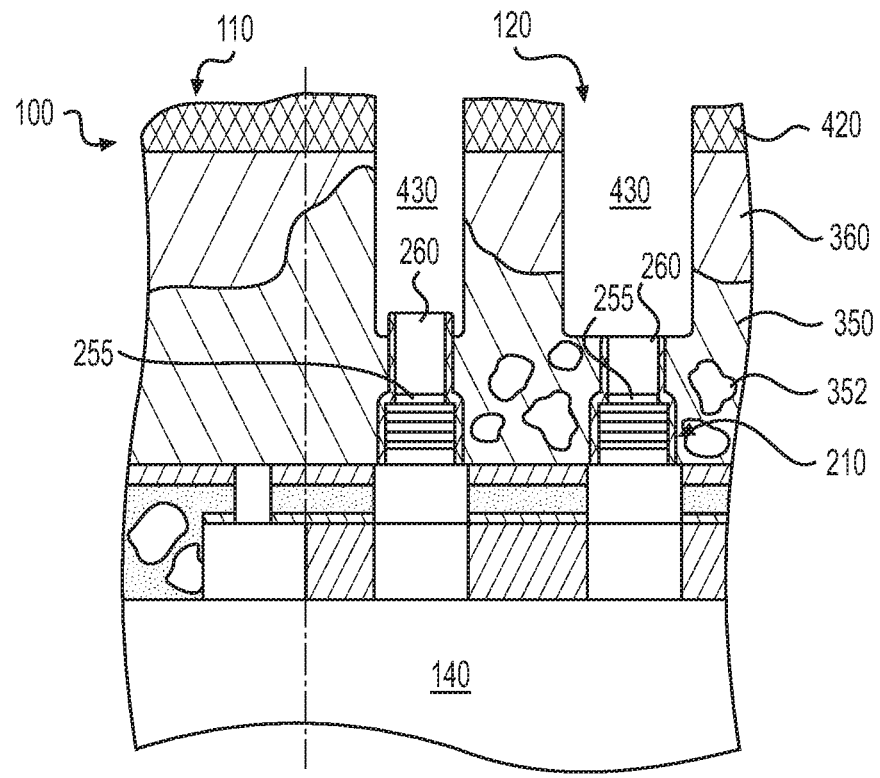
Figure 13B:
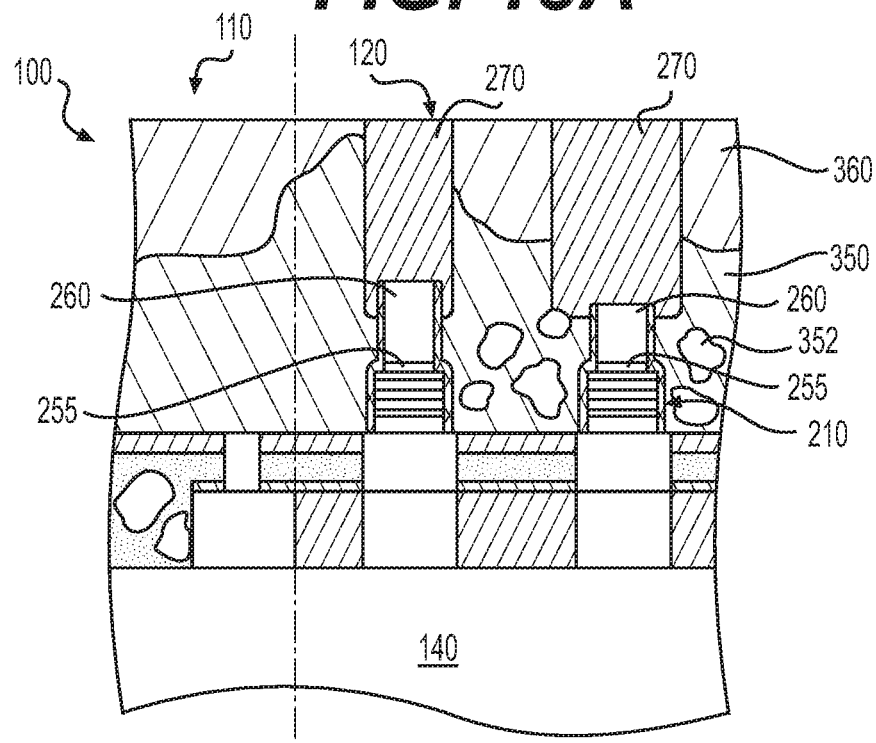

FIGS. 13A and 13B illustrate an exemplary embodiment of the IC device 100 where the surface of the as-deposited ILD layer is planarized using a sacrificial conventional ILD layer prior to forming the vias. As explained with reference to FIGS. 8A and 8B, polishing the sacrificial conventional ILD (i.e., fourth ILD 360) deposited over the third ILD 350 grinds and planarizes the underlying low-k ILD without inducing defects therein. As illustrated in FIG. 13A, a photoresist 420 may then be deposited over the planarized surface of the fourth ILD 360 and exposed to etch the underlying ILD materials and form the cavities 430 corresponding to the second-level vias 270 of the memory portion 120. The via material may then be deposited in the cavities 430 to form the second-level vias 270. The photoresist 420 may then be stripped, and the surface of the fourth ILD 360 polished to planarize the surface of the underlying third ILD 350 and planarize the topography of the ILD (resulting from the underlying magnetoresistive devices). In some embodiments, the polishing operation may be stopped prior to polishing the third ILD 350, and as illustrated in FIG. 13B, a portion of the fourth ILD 360 may be retained on the third ILD 350 surface after the polishing. Retaining a portion of the fourth ILD 360 may ensure that the air gaps 352 are not exposed (e.g., during top contact etch and metal polish). In some embodiments, a metal polishing operation may be used to further polish slightly over the surface of the third ILD 350, just to the surface of the third ILD 350, or into the third ILD 350 without inducing damage to the low-k ILD material. As described with reference to FIGS. 12A and 12B, in some embodiments, the V1 and M2 layers of the logic portion 110 (i.e., the first-level vias 152 and the features 154) may also be formed simultaneously with the second-level vias 270 of the memory portion 120.

Figure 14:
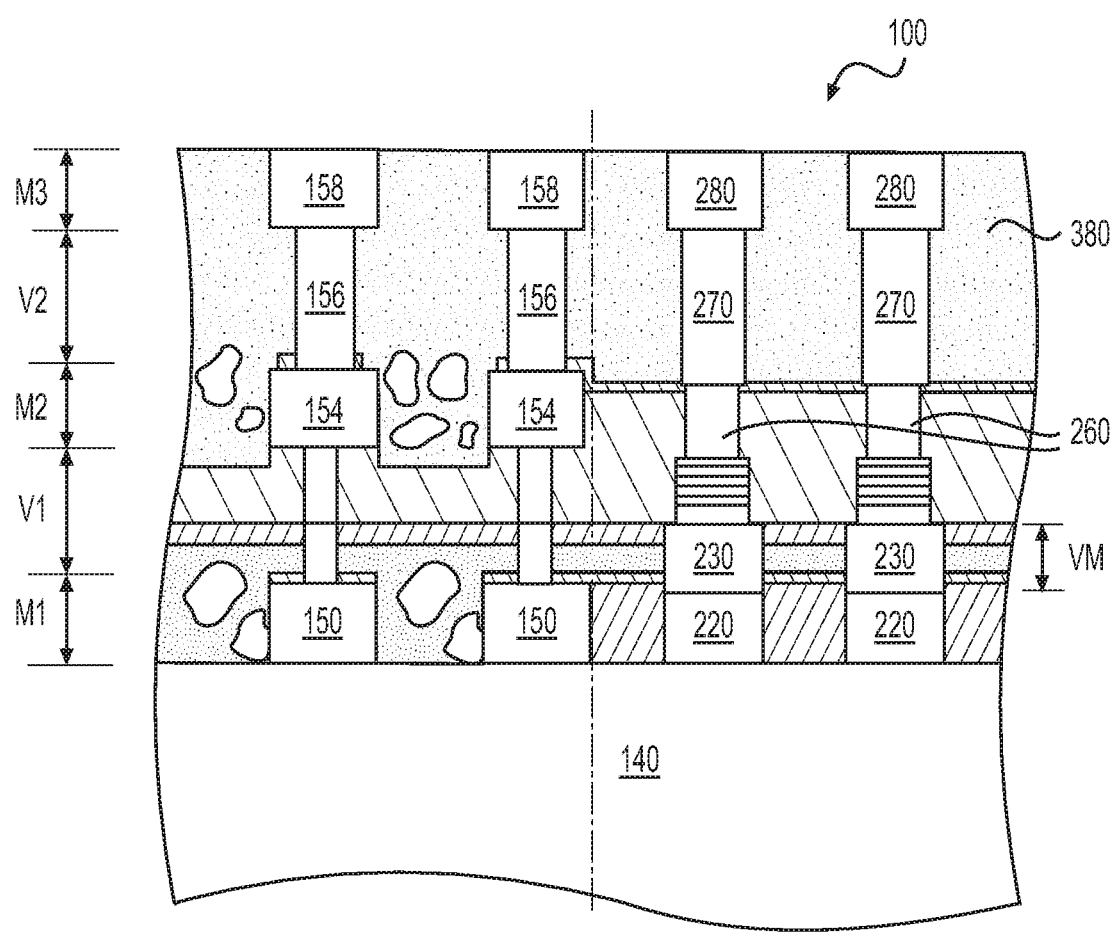

The M3 layer and the V2 layer may then be formed on the IC device 100 using any conventional process. FIG. 14 illustrates the IC device 100 with the M3 layer and the V2 layer formed thereon. Any known process (e.g., dual damascene process, single damascene process, etc.), or a suitable future-developed process, may be used to form these layers. In an exemplary embodiment, a cavity or a trench corresponding the second-level vias 270 may first be formed (e.g., etched) through the fifth ILD 380, and the top regions of these trenches may then be etched (e.g., widened) to correspond to the features of the M3 layer. A conductive material may then be deposited in these trenches to form the vias and the features. In some embodiments, similar to forming air gaps 382 between the features 154 of the M2 layer, an air gap process may be carried out to introduce air gaps (not shown) between the features 158 and 280 of the M3 layer. For example, cavities (similar to cavities 370 of FIG. 10) may be formed between the features 158 and 280 of the M3 layer, and a low-k ILD material (same material as the fifth ILD 380 or a different low-k ILD material) may be deposited in these cavities to form the air gaps. In some embodiments, this cavity filling deposition process may be tailored to promote the formation of air gaps. It should be noted that incorporating air gaps (e.g., air gaps 322, 352, 382, etc.) in any ILD layer is not a requirement. Additional processing may then be carried on the IC device 100 (of FIG. 14) using conventional processing operations to complete the device. That is, additional layers (if any) and other processing steps are carried out to prepare the IC device 100 for use in any desired application. Since these conventional processing steps are well known to a skilled artisan, they are not described herein.

As alluded to above, the magnetoresistive devices (formed using aforementioned described techniques and/or processes) may include a sensor architecture or a memory architecture (among other architectures). For example, in a magnetoresistive device having a memory configuration, the magnetoresistive devices may be electrically connected to an access transistor and configured to couple or connect to various conductors, which may carry one or more control signals, as shown in FIG. 15. The magnetoresistive devices may be used in any suitable application, including, e.g., in a memory configuration. In such instances, the magnetoresistive devices may be formed as an IC device comprising a discrete memory device (e.g., as shown in FIG. 16A) or an embedded memory device having a logic therein (e.g., as shown in FIG. 16B), each including MRAM, which, in one embodiment is representative of one or more arrays of MRAM having a plurality of magnetoresistive devices formed magnetoresistive stacks/structures, according to certain aspects of certain embodiments disclosed herein.

In some aspects, an integrated circuit device is disclosed. The integrated circuit device may include a memory portion including a plurality of magnetoresistive devices. The memory portion may include a plurality of metal conductors separated by a first interlayer dielectric material (ILD). The first ILD is a low-k ILD or an ultra low-k ILD. The integrated circuit device may also include a logic portion including logic circuits. The logic portion may include a plurality of metal conductors separated by a second interlayer dielectric material (ILD).

Various embodiments of the disclosed integrated circuit device may, alternatively or additionally, include one or more of the following features: the second ILD may be a low-k ILD or an ultra low-k ILD; the first ILD may include at least one of carbon doped SiO2 (SiOC), Carbon Doped Oxide (CDO), Organo Silicate Glass (OSG), and spin-on organics; a first thickness of the memory portion may include the first ILD and the first thickness of the logic portion may include the second ILD, wherein the second ILD is different from the first ILD; a first thickness of the memory portion may include a layer of the first ILD positioned below a layer of a third ILD, and the first thickness of the logic portion may include the second ILD, wherein a dielectric constant of the third ILD is greater than a dielectric constant of the first ILD, and wherein the second ILD is one of a low-k ILD or an ultra low-k ILD; a first thickness of the memory portion may include the plurality of magnetoresistive devices separated by the first ILD; the second ILD that separates the metal conductors in the logic portion may include one or more air gaps; and the first ILD that separates the plurality of metal conductors in the memory portion may include air gaps.

In another aspect, a method of fabricating an integrated circuit device including a memory portion and a logic portion is disclosed. The method may include forming a plurality of magnetoresistive devices spaced apart from each other on the memory portion, depositing an encapsulant on the plurality of magnetoresistive devices, and depositing a first interlayer dielectric material (ILD) on the plurality of magnetoresistive devices after depositing the encapsulant. The first ILD may be a low-k ILD or an ultra low-k ILD. The method may also include forming electrical contacts with top surfaces of the plurality of magnetoresistive devices after depositing the first ILD.

Various embodiments of the disclosed method may, alternatively or additionally, include one or more of the following features: after depositing the encapsulant, etching the deposited encapsulant such that sidewalls of the plurality of magnetoresistive devices are covered by the encapsulant; after depositing the encapsulant, removing the deposited encapsulant from the top surfaces of the plurality of magnetoresistive devices; further comprise exposing the top surfaces of the plurality of magnetoresistive devices after the step of depositing the first ILD; further comprise depositing a second ILD over the first ILD before the step of forming the electrical contacts, and polishing a surface of the deposited second ILD using chemical mechanical polishing (CMP) such that at least a portion of the second ILD is retained over the first ILD after the polishing, wherein the second ILD is not a low-k or an ultra low-k ILD; further comprise depositing a second ILD over the first ILD before the step of forming the electrical contacts, and etching the second ILD and the first ILD to expose the top surfaces of the plurality of magnetoresistive devices.

In yet another aspect, a method of fabricating an integrated circuit device including a memory portion and a logic portion is disclosed. The method may include forming a plurality of magnetoresistive devices spaced apart from each other on the memory portion, depositing an encapsulant on the plurality of magnetoresistive devices, depositing a first interlayer dielectric material (ILD) on the plurality of magnetoresistive devices after depositing the encapsulant, depositing a second ILD on the first ILD, wherein the second ILD has a higher dielectric constant than the first ILD, and forming electrical contacts with top surfaces of the plurality of magnetoresistive devices after depositing the second ILD.

Various embodiments of the disclosed method may, alternatively or additionally, include one or more of the following features: further comprise polishing a surface of the deposited second ILD using chemical mechanical polishing (CMP) such that at least a portion of the deposited second ILD is retained over the first ILD after the polishing; further comprise exposing the top surfaces of the plurality of magnetoresistive devices after depositing the second ILD; further comprise, before depositing the first ILD, etching the deposited encapsulant such that at least sidewalls of the plurality of magnetoresistive devices remain covered by the encapsulant; further comprise forming a plurality of metal conductors separated by a second ILD on the logic portion, wherein the second ILD is the same as or different from the first ILD; and the first ILD may be a low-k or an ultra low-k ILD.

Although various embodiments of the present disclosure have been illustrated and described in detail, it will be readily apparent to those skilled in the art that various modifications may be made without departing from the present disclosure or from the scope of the appended claims.

What is claimed is:

1. A method of fabricating an integrated circuit device including a memory portion and a logic portion, comprising:
    forming a plurality of magnetoresistive devices spaced apart from each other on the memory portion;
    depositing an encapsulant on the plurality of magnetoresistive devices;
    depositing a first interlayer dielectric material (ILD) on the plurality of magnetoresistive devices after depositing the encapsulant, wherein the first ILD is a low-k ILD or an ultra low-k ILD;
    depositing a second ILD on the first ILD without first planarizing the deposited first ILD;
    etching the second ILD and the first ILD to expose top surfaces of the plurality of magnetoresistive devices, wherein the second ILD and the first ILD are etched until a portion of each of the plurality of magnetoresistive devices extends over a top surface of the etched first ILD; and
    forming electrical contacts with the exposed top surfaces of the plurality of magnetoresistive devices.

2. The method of claim 1, further comprising, after depositing the encapsulant, etching the deposited encapsulant such that sidewalls of the plurality of magnetoresistive devices are covered by the encapsulant.

3. The method of claim 1, further comprising, after depositing the encapsulant, removing the deposited encapsulant from the top surfaces of the plurality of magnetoresistive devices.

4. The method of claim 1, further comprising exposing the top surfaces of the plurality of magnetoresistive devices after the step of depositing the first ILD.

5. The method of claim 1, further comprising:
    polishing a surface of the deposited second ILD using chemical mechanical polishing (CMP) such that at least a portion of the second ILD is retained over the first ILD after the polishing, wherein the second ILD is not a low-k or an ultra low-k ILD.

6. The method of claim 1, wherein, during the etching of the second ILD and the first ILD, etchant chemistry is incrementally adjusted to be more selective to the second ILD and then to the first ILD.

7. The method of claim 1, wherein the first ILD includes at least one of Carbon-doped $SiO_2$ (SiOC), Carbon-doped Oxide (CDO), Organo Silicate Glass (OSG), and spin-on organics.

8. The method of claim 1, wherein the second ILD is a conventional ILD including at least one of Tetraethyl Orthosilicate (TEOS) and Silicon Dioxide ($SiO_2$).

9. The method of claim 1, wherein the second ILD is not a low-k or an ultra low-k ILD.

10. The method of claim 1, wherein the second ILD is not a low-k or an ultra low-k ILD, and wherein etching the second ILD and the first ILD after depositing the second ILD on the first ILD facilitates planarization of the first ILD without inducing defects therein.

11. The method of claim 1, further comprising, before forming the electrical contacts, polishing the portion of each of the plurality of magnetoresistive devices extending over the top surface of the etched first ILD.

12. A method of fabricating an integrated circuit device including a memory portion and a logic portion, comprising:
    forming a plurality of magnetoresistive devices spaced apart from each other on the memory portion;
    depositing an encapsulant on the plurality of magnetoresistive devices;
    depositing a first interlayer dielectric material (ILD) on the plurality of magnetoresistive devices after depositing the encapsulant;
    depositing a second ILD on the first ILD without first planarizing the deposited first ILD, wherein the second ILD has a higher dielectric constant than the first ILD;
    etching the second ILD and the first ILD to expose top surfaces of the plurality of magnetoresistive devices, wherein the second ILD and the first ILD are etched until a portion of each of the plurality of magnetoresistive devices extends over a top surface of the etched first ILD; and
    forming electrical contacts with the exposed top surfaces of the plurality of magnetoresistive devices.

13. The method of claim 12, further comprising polishing a surface of the deposited second ILD using chemical mechanical polishing (CMP) such that at least a portion of the deposited second ILD is retained over the first ILD after the polishing.

14. The method of claim 12, wherein, during the etching of the second ILD and the first ILD, etchant chemistry is incrementally adjusted to be more selective to the second ILD and then to the first ILD.

15. The method of claim 12, further comprising, before depositing the first ILD, etching the deposited encapsulant such that at least sidewalls of the plurality of magnetoresistive devices remain covered by the encapsulant.

16. The method of claim 12, further comprising forming a plurality of metal conductors separated by the second ILD on the logic portion, wherein the second ILD is different from the first ILD.

17. The method of claim 12, wherein the first ILD is a low-k or an ultra low-k ILD.

18. The method of claim 12, wherein the second ILD is a conventional ILD including at least one of Tetraethyl Orthosilicate (TEOS) and Silicon Dioxide ($SiO_2$), and wherein etching the second ILD and the first ILD after depositing the second ILD on the first ILD facilitates planarization of the first ILD without inducing defects therein.

19. The method of claim 12, further comprising, before forming the electrical contacts, polishing the portion of each of the plurality of magnetoresistive devices extending over the top surface of the etched first ILD.

20. The method of claim 12, further comprising, before forming the electrical contacts, polishing the portion of each of the plurality of magnetoresistive devices extending over the top surface of the etched first ILD using a metal polishing technique.

* * * * *